US011614720B2

(12) United States Patent
Novak, III et al.

(10) Patent No.: US 11,614,720 B2
(45) Date of Patent: Mar. 28, 2023

(54) TEMPERATURE CONTROL IN AN AEROSOL DELIVERY DEVICE

(71) Applicant: RAI STRATEGIC HOLDINGS, INC., Winston-Salem, NC (US)

(72) Inventors: Charles Jacob Novak, III, Winston-Salem, NC (US); Sean A. Daugherty, Yadkinville, NC (US); Michael Ryan Galloway, Winston-Salem, NC (US); Jason L. Wood, Lexington, NC (US); Mark Frisbee, Raleigh, NC (US); Wilson Christopher Lamb, Hillsborough, NC (US); Raymond Charles Henry, Jr., Green Cove Springs, FL (US); Nadi Findikli, Clinton, NJ (US)

(73) Assignee: RAI Strategic Holdings, Inc., Winston-Salem, NC (US)

( * ) Notice: Subject to any disclaimer, the term of this patent is extended or adjusted under 35 U.S.C. 154(b) by 656 days.

(21) Appl. No.: 16/668,929

(22) Filed: Oct. 30, 2019

(65) Prior Publication Data

US 2020/0154787 A1    May 21, 2020

Related U.S. Application Data

(60) Provisional application No. 62/911,595, filed on Oct. 7, 2019, provisional application No. 62/769,296, filed on Nov. 19, 2018.

(51) Int. Cl.
*A24F 13/00* (2006.01)
*G05B 15/02* (2006.01)
(Continued)

(52) U.S. Cl.
CPC .............. *G05B 15/02* (2013.01); *A24F 40/57* (2020.01); *G05B 11/28* (2013.01); *H03K 7/08* (2013.01); *H05B 1/0297* (2013.01)

(58) Field of Classification Search
CPC ....................................................... A24F 47/00
(Continued)

(56) References Cited

U.S. PATENT DOCUMENTS 2,057,353 A   10/1936  Whittemore, Jr.
2,104,266 A    1/1938  McCormick
(Continued)

FOREIGN PATENT DOCUMENTS

CN    1541577    11/2004
CN    2719043     8/2005
(Continued)

OTHER PUBLICATIONS

International Search Report from corresponding International Appl. No. PCT/IB2019/059373, dated Jan. 17, 2020.

*Primary Examiner* — Phuong K Dinh
(74) *Attorney, Agent, or Firm* — Womble Bond Dickinson (US) LLP

(57) ABSTRACT

An aerosol delivery device is provided that includes a power source, a heating element, a switch coupled to and between the power source and the heating element, and processing circuitry coupled to the switch. The processing circuitry outputs a PWM signal during a heating time period to cause the switch to switchably connect and disconnect the output voltage to the heating element to power the heating element. The processing circuitry outputs a pulse of known current to the heating element, and measure voltage across the heating element, between adjacent pulses of the PWM signal. And the processing circuitry calculates the resistance of the heating element based on the known current and the voltage, (Continued)

calculates the temperature of the heating element based on the resistance, and adjusts a duty cycle of the PWM signal when the temperature deviates from a predetermined target.

26 Claims, 11 Drawing Sheets

(51) Int. Cl.
  *H05B 1/02* (2006.01)
  *H03K 7/08* (2006.01)
  *A24F 40/57* (2020.01)
  *G05B 11/28* (2006.01)
(58) Field of Classification Search
  USPC .................................................. 131/328–329
  See application file for complete search history.

(56) References Cited

U.S. PATENT DOCUMENTS

| | | | |
|---|---|---|---|
| 3,200,819 A | 8/1965 | Gilbert | |
| 4,922,901 A | 5/1990 | Brooks et al. | |
| 5,043,560 A | 8/1991 | Masreliez | |
| 5,060,671 A | 10/1991 | Counts et al. | |
| 5,093,894 A | 3/1992 | Deevi et al. | |
| 5,894,841 A | 4/1999 | Voges | |
| 6,125,853 A | 10/2000 | Susa et al. | |
| 6,155,268 A | 12/2000 | Takeuchi | |
| 7,117,867 B2 | 10/2006 | Cox et al. | |
| 7,832,410 B2 | 11/2010 | Hon | |
| 8,314,591 B2 | 11/2012 | Teny et al. | |
| 8,365,742 B2 | 2/2013 | Hon | |
| 8,499,766 B1 | 8/2013 | Newton | |
| 8,528,569 B1 | 9/2013 | Newton | |
| 8,833,364 B2 | 9/2014 | Buchberger | |
| 9,220,304 B2 | 12/2015 | Greim | |
| 9,462,831 B2 | 10/2016 | Liu | |
| 9,814,262 B2 | 11/2017 | Peleg et al. | |
| 9,814,263 B2 | 11/2017 | Cochand et al. | |
| 9,877,508 B2 | 1/2018 | Kane | |
| 9,949,507 B2 | 4/2018 | Flick | |
| 10,015,990 B2 | 7/2018 | Mironov | |
| 10,028,537 B1 | 7/2018 | Hawes et al. | |
| 10,058,125 B2 | 8/2018 | Worm et al. | |
| 10,080,851 B2 | 9/2018 | Davidson et al. | |
| 10,085,481 B2 | 10/2018 | Verleur et al. | |
| 10,092,037 B2 | 10/2018 | Tucker et al. | |
| 10,104,913 B2 | 10/2018 | Lau et al. | |
| 10,117,463 B2 | 11/2018 | Thomas | |
| 10,117,467 B2 | 11/2018 | Hawes et al. | |
| 2005/0016550 A1 | 1/2005 | Katase | |
| 2006/0196518 A1 | 9/2006 | Hon | |
| 2008/0092912 A1 | 4/2008 | Robinson et al. | |
| 2009/0095311 A1 | 4/2009 | Hon | |
| 2009/0126745 A1 | 5/2009 | Hon | |
| 2009/0151717 A1 | 6/2009 | Bowen et al. | |
| 2009/0188490 A1 | 7/2009 | Hon | |
| 2009/0272379 A1 | 11/2009 | Thorens et al. | |
| 2009/0320863 A1 | 12/2009 | Fernando et al. | |
| 2011/0094523 A1 | 4/2011 | Thorens et al. | |
| 2011/0126848 A1 | 6/2011 | Zuber et al. | |
| 2011/0155718 A1 | 6/2011 | Greim et al. | |
| 2011/0168194 A1 | 7/2011 | Hon | |
| 2011/0265806 A1 | 11/2011 | Alarcon et al. | |
| 2013/0037041 A1 | 2/2013 | Worm et al. | |
| 2013/0042865 A1 | 2/2013 | Monsees et al. | |
| 2013/0104916 A1 | 5/2013 | Bellinger et al. | |
| 2013/0306084 A1 | 11/2013 | Flick | |
| 2013/0319435 A1 | 12/2013 | Flick | |
| 2014/0000638 A1 | 1/2014 | Sebastian et al. | |
| 2014/0096781 A1 | 4/2014 | Sears et al. | |
| 2014/0096782 A1 | 4/2014 | Ampolini et al. | |
| 2014/0253144 A1 | 9/2014 | Novak et al. | |
| 2014/0261408 A1 | 9/2014 | DePiano et al. | |
| 2014/0261486 A1 | 9/2014 | Potter et al. | |
| 2014/0261487 A1 | 9/2014 | Chapman et al. | |
| 2014/0366898 A1 | 12/2014 | Monsees et al. | |
| 2015/0020832 A1 | 1/2015 | Greim et al. | |
| 2015/0150308 A1 | 6/2015 | Monsees et al. | |
| 2015/0164142 A1 | 6/2015 | Li et al. | |
| 2015/0208729 A1 | 7/2015 | Monsees et al. | |
| 2015/0313287 A1 | 11/2015 | Verleur et al. | |
| 2015/0359263 A1 | 12/2015 | Bellinger | |
| 2016/0057811 A1 | 2/2016 | Alarcon et al. | |
| 2016/0157524 A1 | 6/2016 | Bowen et al. | |
| 2016/0242466 A1 | 8/2016 | Lord et al. | |
| 2016/0374397 A1 | 12/2016 | Jordan et al. | |
| 2017/0027226 A1 | 2/2017 | Mironov et al. | |
| 2017/0071256 A1 | 3/2017 | Verleur et al. | |
| 2017/0095005 A1* | 4/2017 | Monsees | H05B 3/04 |
| 2017/0135404 A1 | 5/2017 | Reevell | |
| 2017/0135405 A1 | 5/2017 | Reevell | |
| 2017/0135406 A1 | 5/2017 | Reevell | |
| 2017/0143042 A1 | 5/2017 | Batista et al. | |
| 2017/0215478 A1 | 8/2017 | Harrison et al. | |
| 2017/0215485 A1 | 8/2017 | Zitzke | |
| 2017/0231281 A1 | 8/2017 | Hatton et al. | |
| 2017/0231282 A1 | 8/2017 | Hatton et al. | |
| 2017/0251728 A1 | 9/2017 | Peleg et al. | |
| 2017/0273736 A1 | 9/2017 | Paamand | |
| 2017/0325289 A1 | 11/2017 | Liu | |
| 2017/0340011 A1 | 11/2017 | Batista | |
| 2017/0340012 A1 | 11/2017 | Mironov et al. | |
| 2017/0347707 A1 | 12/2017 | Xiang | |
| 2017/0347711 A1 | 12/2017 | Litten et al. | |
| 2017/0347712 A1 | 12/2017 | Singh | |
| 2017/0367410 A1 | 12/2017 | Hon | |
| 2018/0000157 A1 | 1/2018 | Batista et al. | |
| 2018/0000160 A1 | 1/2018 | Taschner et al. | |
| 2018/0014575 A1 | 1/2018 | Fursa | |
| 2018/0020731 A1 | 1/2018 | Rasmussen et al. | |
| 2018/0020736 A1 | 1/2018 | Silvestrini | |
| 2018/0035717 A1 | 2/2018 | Batista | |
| 2018/0042306 A1 | 2/2018 | Atkins et al. | |
| 2018/0043114 A1 | 2/2018 | Bowen et al. | |
| 2018/0070648 A1 | 3/2018 | Monsees et al. | |
| 2018/0077967 A1 | 3/2018 | Hatton et al. | |
| 2018/0084608 A1 | 3/2018 | Bernauer et al. | |
| 2018/0084831 A1 | 3/2018 | Mironov | |
| 2018/0103685 A1 | 4/2018 | Yener | |
| 2018/0132525 A1 | 5/2018 | Patil et al. | |
| 2018/0140019 A1 | 5/2018 | Guo et al. | |
| 2018/0177230 A1 | 6/2018 | Hawes et al. | |
| 2018/0206557 A1 | 7/2018 | Peleg et al. | |
| 2018/0213850 A1 | 8/2018 | Brinkley et al. | |
| 2018/0235282 A1 | 8/2018 | Gao et al. | |
| 2018/0242643 A1 | 8/2018 | Silvestrini et al. | |
| 2018/0280637 A1 | 10/2018 | Mayle et al. | |
| 2018/0295888 A1 | 10/2018 | Newcomb et al. | |
| 2018/0296777 A1 | 10/2018 | Terry et al. | |
| 2018/0303161 A1 | 10/2018 | Bilat | |
| 2018/0325182 A1 | 11/2018 | Zitzke et al. | |

FOREIGN PATENT DOCUMENTS

| | | |
|---|---|---|
| CN | 201379072 | 1/2010 |
| EP | 1 618 803 | 1/2006 |
| GB | 2542770 A | 3/2017 |
| WO | WO 2004/080216 | 9/2004 |
| WO | WO 2005/099494 | 10/2005 |
| WO | WO 2007/131449 | 11/2007 |
| WO | WO 2016/026811 | 2/2016 |
| WO | WO 2017/051006 | 9/2016 |
| WO | WO 2016200382 | 12/2016 |
| WO | WO 2016/207442 | 5/2017 |
| WO | WO 2017/147560 | 8/2017 |
| WO | WO 2018/167166 | 9/2018 |
| WO | WO 2018/202732 | 11/2018 |

* cited by examiner

TEMPERATURE CONTROL IN AN AEROSOL DELIVERY DEVICE

CROSS-REFERENCE TO RELATED APPLICATION(S)

The present application claims priority to U.S. Provisional Patent Application No. 62/769,296, entitled: Management System for Control Functions in a Vaporization System, filed on Nov. 19, 2018, and U.S. Provisional Patent Application No. 62/911,595, entitled: Temperature Control in an Aerosol Delivery Device, filed on Oct. 7, 2019, both of which are incorporated herein by reference.

TECHNOLOGICAL FIELD

The present disclosure relates to aerosol delivery devices such as smoking articles that produce aerosol. The smoking articles may be configured to heat or dispense an aerosol precursor or otherwise produce an aerosol from an aerosol precursor, which may incorporate materials that may be made or derived from tobacco or otherwise incorporate tobacco, the precursor being capable of forming an inhalable substance for human consumption.

BACKGROUND

Many smoking devices have been proposed through the years as improvements upon, or alternatives to, smoking products that require combusting tobacco for use. Many of those devices purportedly have been designed to provide the sensations associated with cigarette, cigar, or pipe smoking, but without delivering considerable quantities of incomplete combustion and pyrolysis products that result from the burning of tobacco. To this end, there have been proposed numerous smoking products, flavor generators, and medicinal inhalers that utilize electrical energy to vaporize or heat a volatile material, or attempt to provide the sensations of cigarette, cigar, or pipe smoking without burning tobacco to a significant degree. See, for example, the various alternative smoking articles, aerosol delivery devices, and heat generating sources set forth in the background art described in U.S. Pat. No. 7,726,320 to Robinson et al., U.S. Pat. Pub. No. 2013/0255702 to Griffith Jr. et al., and U.S. Pat. Pub. No. 2014/0096781 to Sears et al., which are incorporated herein by reference. See also, for example, the various types of smoking articles, aerosol delivery devices, and electrically powered heat generating sources referenced by brand name and commercial source in U.S. Pat. Pub. No. 2015/0216232 to Bless et al., which is incorporated herein by reference.

However, it may be desirable to provide aerosol delivery devices with improved electronics such as may extend usability of the devices.

BRIEF SUMMARY

The present disclosure relates to aerosol delivery devices configured to produce aerosol and which aerosol delivery devices, in some implementations, may be referred to as electronic cigarettes, heat-not-burn cigarettes (or devices), or no-heat-no-burn devices. The present disclosure includes, without limitation, the following example implementations.

Some example implementations provide an aerosol delivery device comprising: a power source configured to provide an output voltage; a heating element powerable to vaporize components of an aerosol precursor composition and thereby produce an aerosol, the heating element having a resistance that is variable and proportional to a temperature of the heating element; a switch coupled to and between the power source and the heating element; and processing circuitry coupled to the switch, and configured to output a pulse-width modulation (PWM) signal during a heating time period to cause the switch to switchably connect and disconnect the output voltage to the heating element to power the heating element, the PWM signal including pulses over which the output voltage to the heating element is connected, and between which the output voltage to the heating element is disconnected, wherein the processing circuitry is further configured to output a pulse of known current to the heating element, and measure voltage across the heating element, between adjacent pulses of the PWM signal, and wherein the processing circuitry is configured to calculate the resistance of the heating element based on the known current and the voltage, calculate the temperature of the heating element based on the resistance, and adjust a duty cycle of the PWM signal when the temperature deviates from a predetermined target.

In some example implementations of the aerosol delivery device of any preceding example implementation, or any combination of any preceding example implementations, the processing circuitry being configured to adjust the duty cycle of the PWM signal includes being configured to increase or decrease the duty cycle of the PWM signal when the temperature is respectively below or above the predetermined target.

In some example implementations of the aerosol delivery device of any preceding example implementation, or any combination of any preceding example implementations, the processing circuitry configured to output the pulse includes the processing circuitry configured to output pulses of the known current, interspersed between the pulses of the PWM signal, the processing circuitry configured to measure the voltage across the heating element for each of the pulses.

In some example implementations of the aerosol delivery device of any preceding example implementation, or any combination of any preceding example implementations, the pulse of known current that is output to the heating element causes the voltage across the heating element to be produced, and the known current is selected such that the voltage is less than one-half the output voltage provided by the power source.

In some example implementations of the aerosol delivery device of any preceding example implementation, or any combination of any preceding example implementations, outside the heating time period in which the PWM signal is absent and the output voltage to the heating element is disconnected, the processing circuitry is further configured to output a second pulse of the known current to the heating element, and measure a second voltage across the heating element, wherein the processing circuitry is configured to calculate a nominal resistance of the heating element based on the known current and the second voltage, and calculate a nominal temperature of the heating element based on nominal resistance, and wherein the processing circuitry is configured to calculate the temperature of the heating element further based on the nominal temperature of the heating element.

In some example implementations of the aerosol delivery device of any preceding example implementation, or any combination of any preceding example implementations, the processing circuitry is further configured to calculate a quantity of heat at the heating element during the heating time period, and execute a lockout of the heating element when the quantity of heat at the heating element is greater than a threshold quantity of heat.

Some example implementations provide an aerosol delivery device comprising: a power source configured to provide an output voltage; a heating element powerable to vaporize components of an aerosol precursor composition and thereby produce an aerosol; a switch coupled to and between the power source and the heating element; and processing circuitry coupled to the switch, and configured to output a pulse-width modulation (PWM) signal during a heating time period to cause the switch to switchably connect and disconnect the output voltage to the heating element to power the heating element, the PWM signal including pulses over which the output voltage to the heating element is connected, and between which the output voltage to the heating element is disconnected, wherein the processing circuitry is further configured to calculate a quantity of heat at the heating element during the heating time period, and execute a lockout of the heating element when the quantity of heat at the heating element is greater than a threshold quantity of heat.

In some example implementations of the aerosol delivery device of any preceding example implementation, or any combination of any preceding example implementations, the processing circuitry configured to calculate the quantity of heat at the heating element includes the processing circuitry configured to repeatedly calculate the quantity of heat at the heating element during the heating time period.

In some example implementations of the aerosol delivery device of any preceding example implementation, or any combination of any preceding example implementations, the heating time period is initiated by a user puff that causes a flow of air through at least a portion of the aerosol delivery device, and wherein the processing circuitry configured to calculate the quantity of heat at the heating element includes the processing circuitry configured to at least: measure a heating current through and a heating voltage across the heating element; calculate a first quantity of heat added to the heating element based on the heating current, the heating voltage, an elapsed time, and the duty cycle of the PWM signal; determine a second quantity of heat removed from the heating element by forced convection due to the flow of air caused by the user puff; and calculate the quantity of heat at the heating element based on the first quantity of heat and the second quantity of heat.

In some example implementations of the aerosol delivery device of any preceding example implementation, or any combination of any preceding example implementations, the processing circuitry configured to execute the lockout of the heating element includes the processing circuitry configured to at least: interrupt the PWM signal to cause the switch to disconnect the output voltage to the heating element; and keep the output voltage to the heating element disconnected until the quantity of heat at the heating element is a quantity less than the threshold quantity of heat.

In some example implementations of the aerosol delivery device of any preceding example implementation, or any combination of any preceding example implementations, the processing circuitry configured to execute the lockout of the heating element further includes the processing circuitry configured to at least: determine a third quantity of heat removed from the heating element by natural convection due to exposure of the heating element to ambient air; and calculate a quantity of any remaining heat at the heating element from the heating time period, based on the quantity of heat at the heating element, and the third quantity of heat, the processing circuitry configured to keep the output voltage to the heating element disconnected until the quantity of any remaining heat at the heating element is the quantity less than the threshold quantity of heat.

In some example implementations of the aerosol delivery device of any preceding example implementation, or any combination of any preceding example implementations, the user puff is one of a plurality of user puffs that also includes a second user puff that causes a second flow of air through at least a portion of the aerosol delivery device, and that initiates a second heating time period, wherein between the heating time period and the second heating time period, the processing circuitry is further configured to at least: determine a third quantity of heat removed from the heating element by natural convection due to exposure of the heating element to ambient air; and calculate a quantity of any remaining heat at the heating element from the heating time period, based on the quantity of heat at the heating element, and the third quantity of heat, and wherein the processing circuitry is further configured to calculate the quantity of heat at the heating element during the second heating time period, based on the quantity of any remaining heat at the heating element from the heating time period.

Some example implementations provide a method of controlling an aerosol delivery device including a power source configured to provide an output voltage, and a heating element powerable to vaporize components of an aerosol precursor composition and thereby produce an aerosol, the heating element having a resistance that is variable and proportional to a temperature of the heating element, the method comprising: switchably connecting and disconnecting the output voltage to the heating element to power the heating element according to a pulse-width modulation (PWM) signal, the PWM signal including pulses over which the output voltage to the heating element is connected, and between which the output voltage to the heating element is disconnected; outputting a pulse of known current to the heating element, and measuring voltage across the heating element, between adjacent pulses of the PWM signal; calculating the resistance of the heating element based on the known current and the voltage; calculating the temperature of the heating element based on the resistance; and adjusting a duty cycle of the PWM signal when the temperature deviates from a predetermined target.

In some example implementations of the method of any preceding example implementation, or any combination of any preceding example implementations, adjusting the duty cycle of the PWM signal includes increasing or decreasing the duty cycle of the PWM signal when the temperature is respectively below or above the predetermined target.

In some example implementations of the method of any preceding example implementation, or any combination of any preceding example implementations, outputting the pulse includes outputting pulses of the known current, interspersed between the pulses of the PWM signal, the voltage across the heating element measured for each of the pulses.

In some example implementations of the method of any preceding example implementation, or any combination of any preceding example implementations, the pulse of known current that is output to the heating element causes the voltage across the heating element to be produced, and the method further comprises selecting the known current such that the voltage is less than one-half the output voltage provided by the power source.

In some example implementations of the method of any preceding example implementation, or any combination of any preceding example implementations, outside the heating time period in which the PWM signal is absent and the output voltage to the heating element is disconnected, the method further comprises: outputting a second pulse of the known current to the heating element, and measuring a second voltage across the heating element; calculating a nominal resistance of the heating element based on the known current and the second voltage; and calculating a nominal temperature of the heating element based on nominal resistance, and wherein the temperature of the heating element is calculated further based on the nominal temperature of the heating element.

In some example implementations of the method of any preceding example implementation, or any combination of any preceding example implementations, the method further comprises: calculating a quantity of heat at the heating element during the heating time period; and executing a lockout of the heating element when the quantity of heat at the heating element is greater than a threshold quantity of heat.

Some example implementations provide a method of controlling an aerosol delivery device including a power source configured to provide an output voltage, and a heating element powerable to vaporize components of an aerosol precursor composition and thereby produce an aerosol, the method comprising: switchably connecting and disconnecting the output voltage to the heating element to power the heating element according to a pulse-width modulation (PWM) signal, the PWM signal including pulses over which the output voltage to the heating element is connected, and between which the output voltage to the heating element is disconnected; calculating a quantity of heat at the heating element during the heating time period; and executing a lockout of the heating element when the quantity of heat at the heating element is greater than a threshold quantity of heat.

In some example implementations of the method of any preceding example implementation, or any combination of any preceding example implementations, calculating the quantity of heat at the heating element includes repeatedly calculating the quantity of heat at the heating element during the heating time period.

In some example implementations of the method of any preceding example implementation, or any combination of any preceding example implementations, the heating time period is initiated by a user puff that causes a flow of air through at least a portion of the aerosol delivery device, and wherein calculating the quantity of heat at the heating element includes at least: measuring a heating current through and a heating voltage across the heating element; calculating a first quantity of heat added to the heating element based on the heating current, the heating voltage, an elapsed time, and the duty cycle of the PWM signal; determining a second quantity of heat removed from the heating element by forced convection due to the flow of air caused by the user puff; and calculating the quantity of heat at the heating element based on the first quantity of heat and the second quantity of heat.

In some example implementations of the method of any preceding example implementation, or any combination of any preceding example implementations, executing the lockout of the heating element includes at least: interrupting the PWM signal to disconnect the output voltage to the heating element; and keeping the output voltage to the heating element disconnected until the quantity of heat at the heating element is a quantity less than the threshold quantity of heat.

In some example implementations of the method of any preceding example implementation, or any combination of any preceding example implementations, executing the lockout of the heating element further includes at least: determining a third quantity of heat removed from the heating element by natural convection due to exposure of the heating element to ambient air; and calculating a quantity of any remaining heat at the heating element from the heating time period, based on the quantity of heat at the heating element, and the third quantity of heat, keeping the output voltage to the heating element disconnected includes keeping the output voltage to the heating element disconnected until the quantity of any remaining heat at the heating element is the quantity less than the threshold quantity of heat.

In some example implementations of the method of any preceding example implementation, or any combination of any preceding example implementations, the user puff is one of a plurality of user puffs that also includes a second user puff that causes a second flow of air through at least a portion of the aerosol delivery device, and that initiates a second heating time period, wherein between the heating time period and the second heating time period, the method further comprises to at least: determining a third quantity of heat removed from the heating element by natural convection due to exposure of the heating element to ambient air; and calculating a quantity of any remaining heat at the heating element from the heating time period, based on the quantity of heat at the heating element, and the third quantity of heat, and wherein the method further comprises calculating the quantity of heat at the heating element during the second heating time period, based on the quantity of any remaining heat at the heating element from the heating time period.

These and other features, aspects, and advantages of the present disclosure will be apparent from a reading of the following detailed description together with the accompanying figures, which are briefly described below. The present disclosure includes any combination of two, three, four or more features or elements set forth in this disclosure, regardless of whether such features or elements are expressly combined or otherwise recited in a specific example implementation described herein. This disclosure is intended to be read holistically such that any separable features or elements of the disclosure, in any of its aspects and example implementations, should be viewed as combinable, unless the context of the disclosure clearly dictates otherwise.

It will therefore be appreciated that this Brief Summary is provided merely for purposes of summarizing some example implementations so as to provide a basic understanding of some aspects of the disclosure. Accordingly, it will be appreciated that the above described example implementations are merely examples and should not be construed to narrow the scope or spirit of the disclosure in any way. Other example implementations, aspects and advantages will become apparent from the following detailed description taken in conjunction with the accompanying figures which illustrate, by way of example, the principles of some described example implementations.

BRIEF DESCRIPTION OF THE FIGURES

Figure 1:
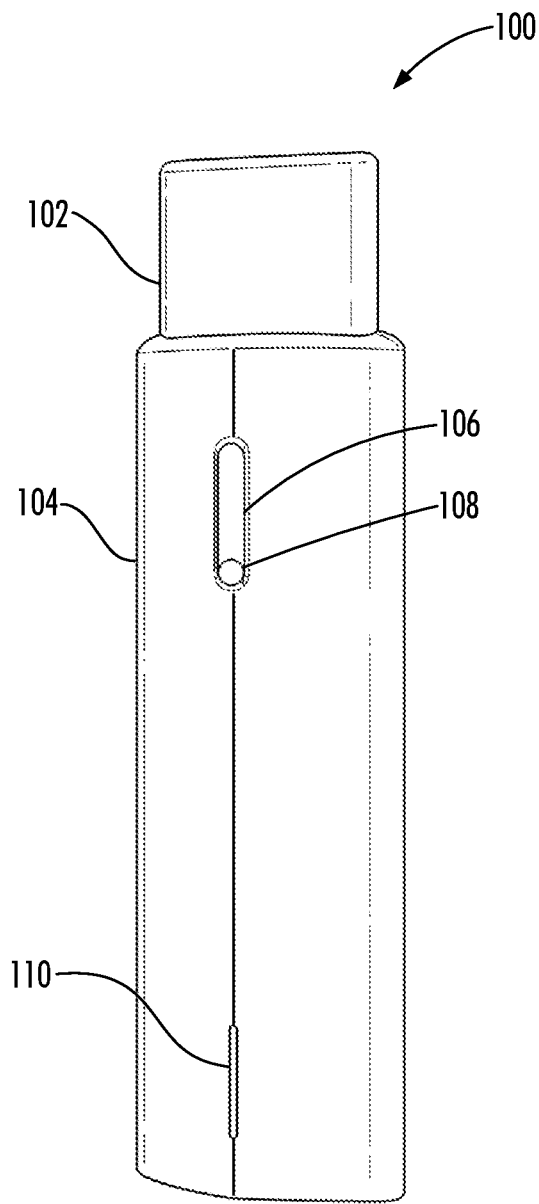
Figure 2:
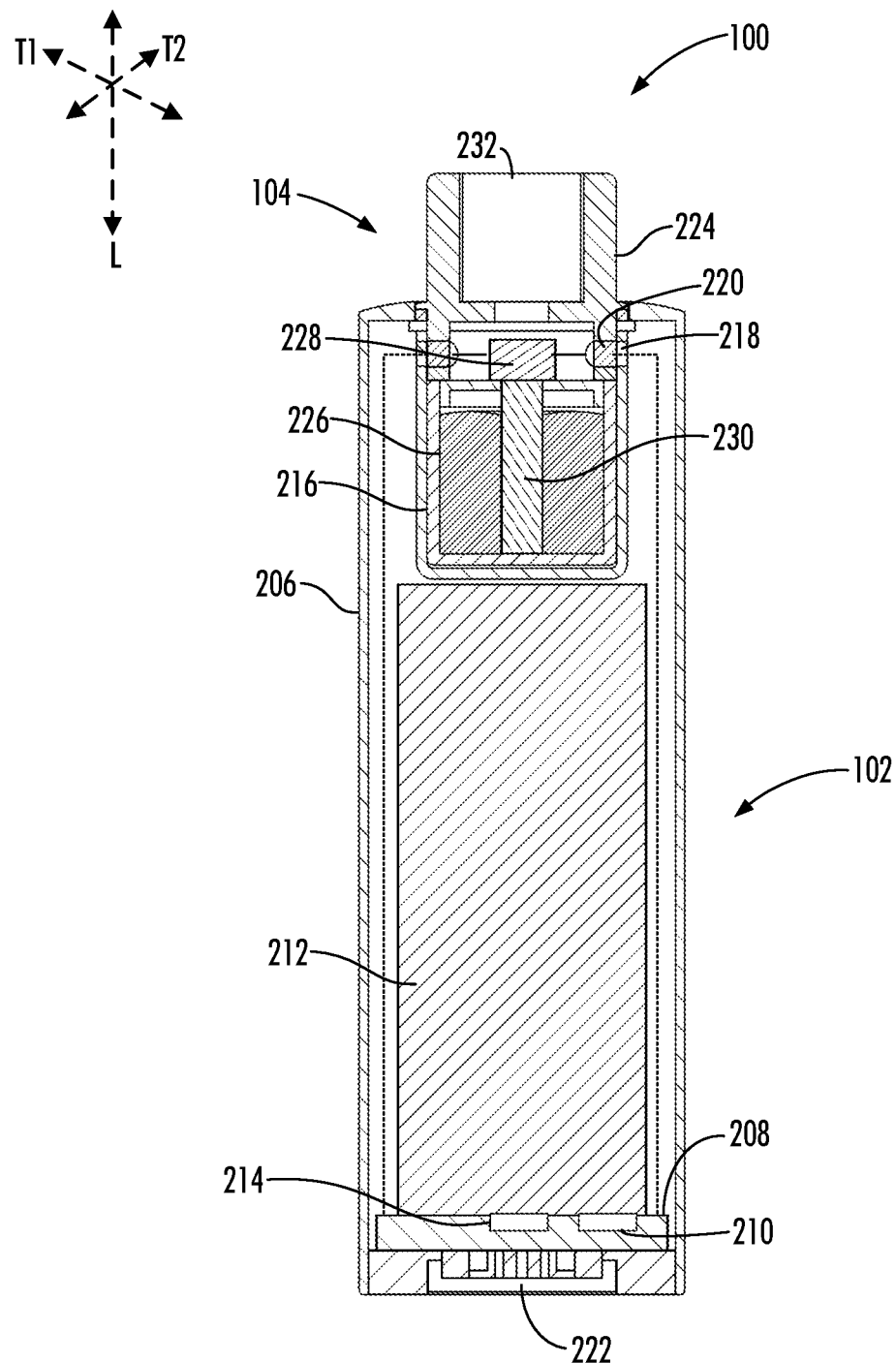
Figure 3:
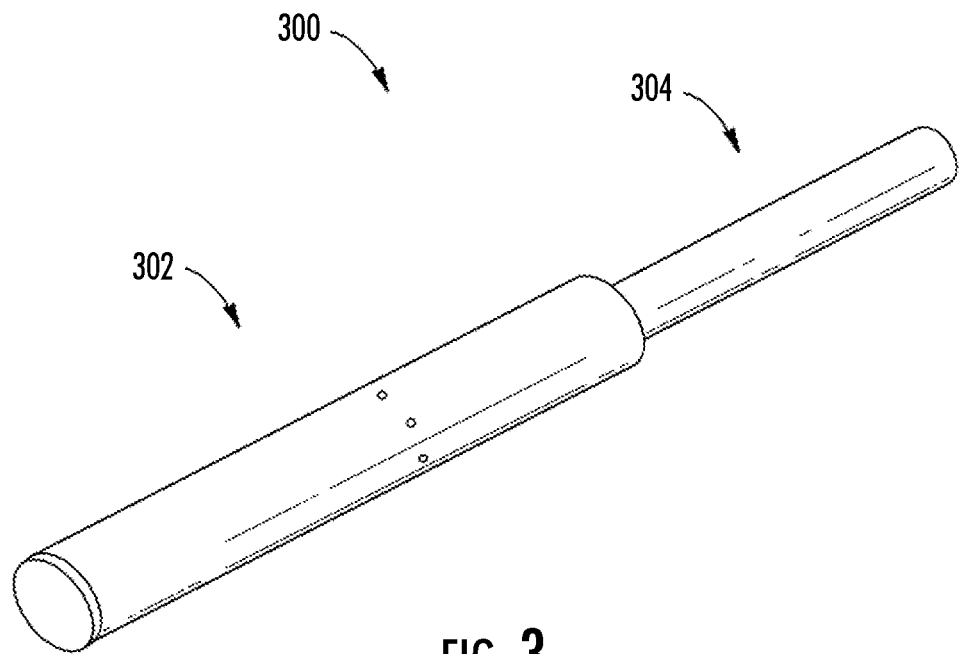
Figure 4:
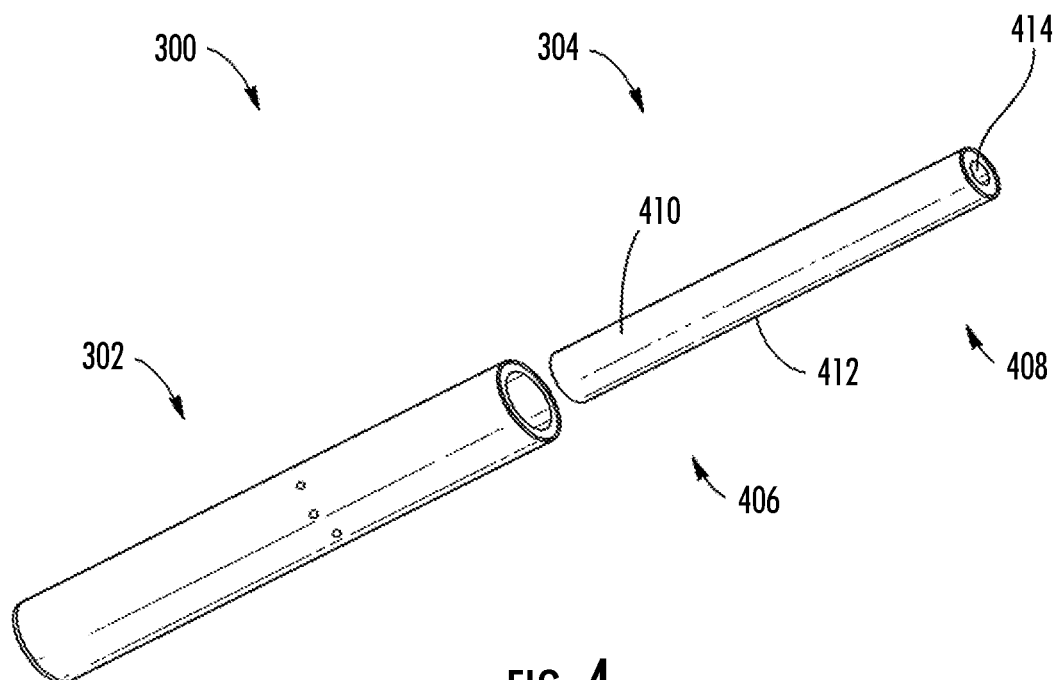
Figure 5:
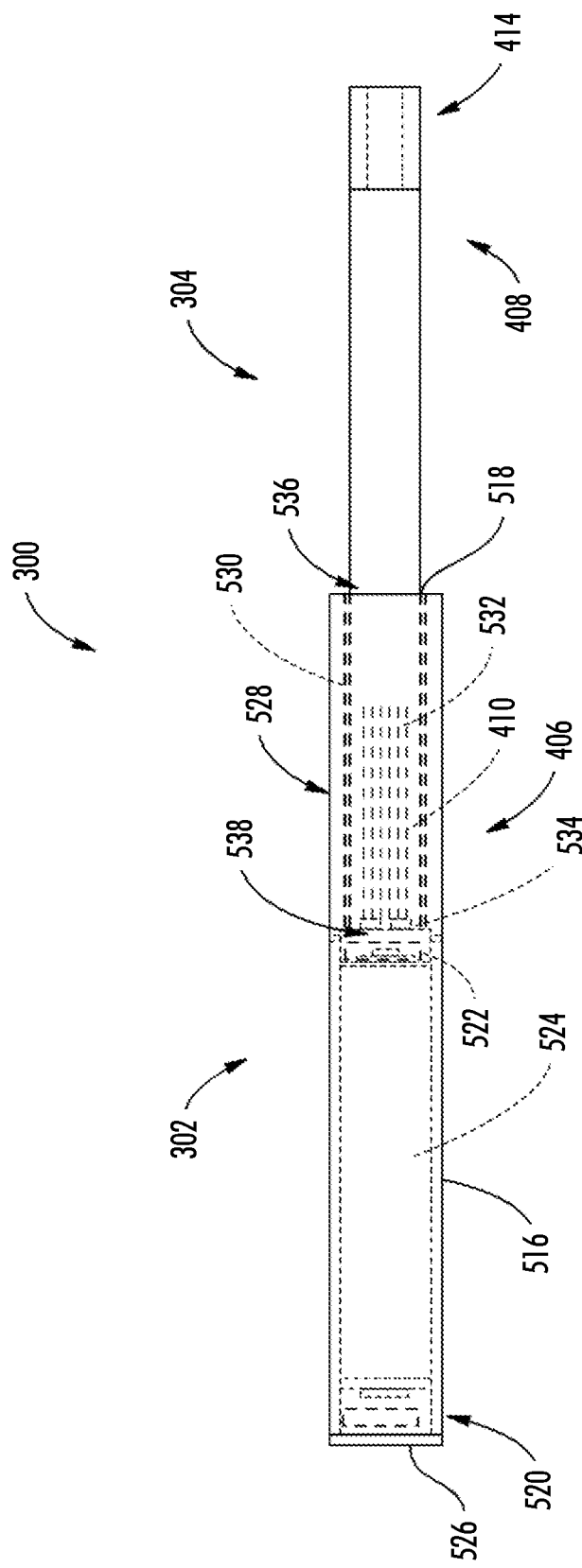
Figure 6:
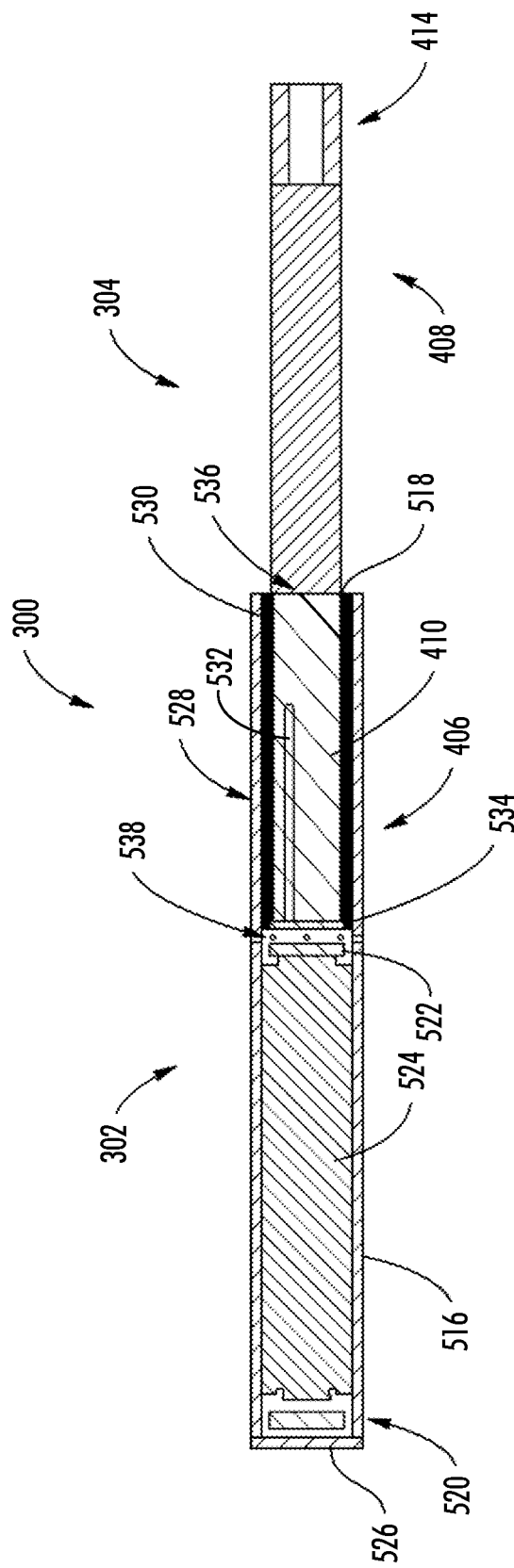
Figure 7:
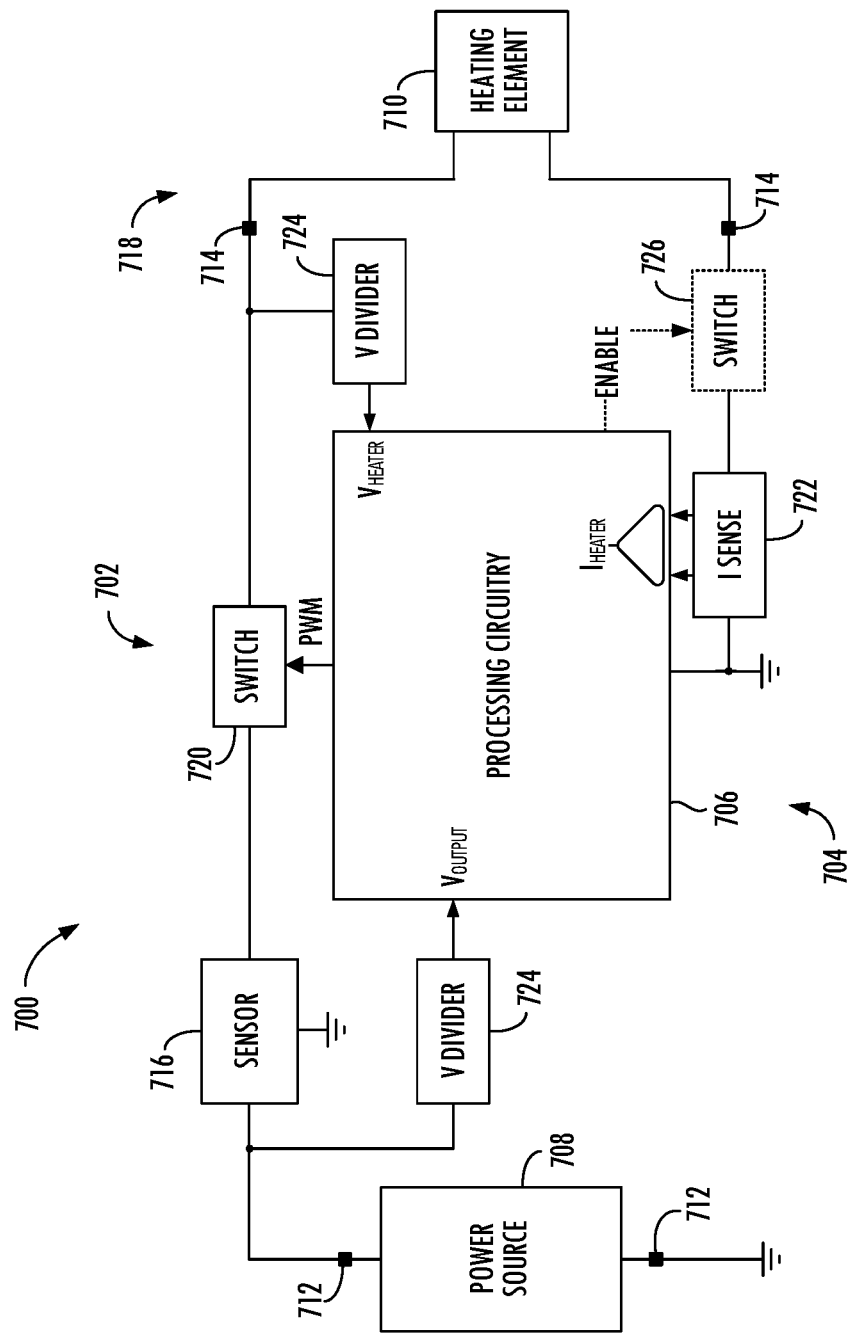
Figure 8:
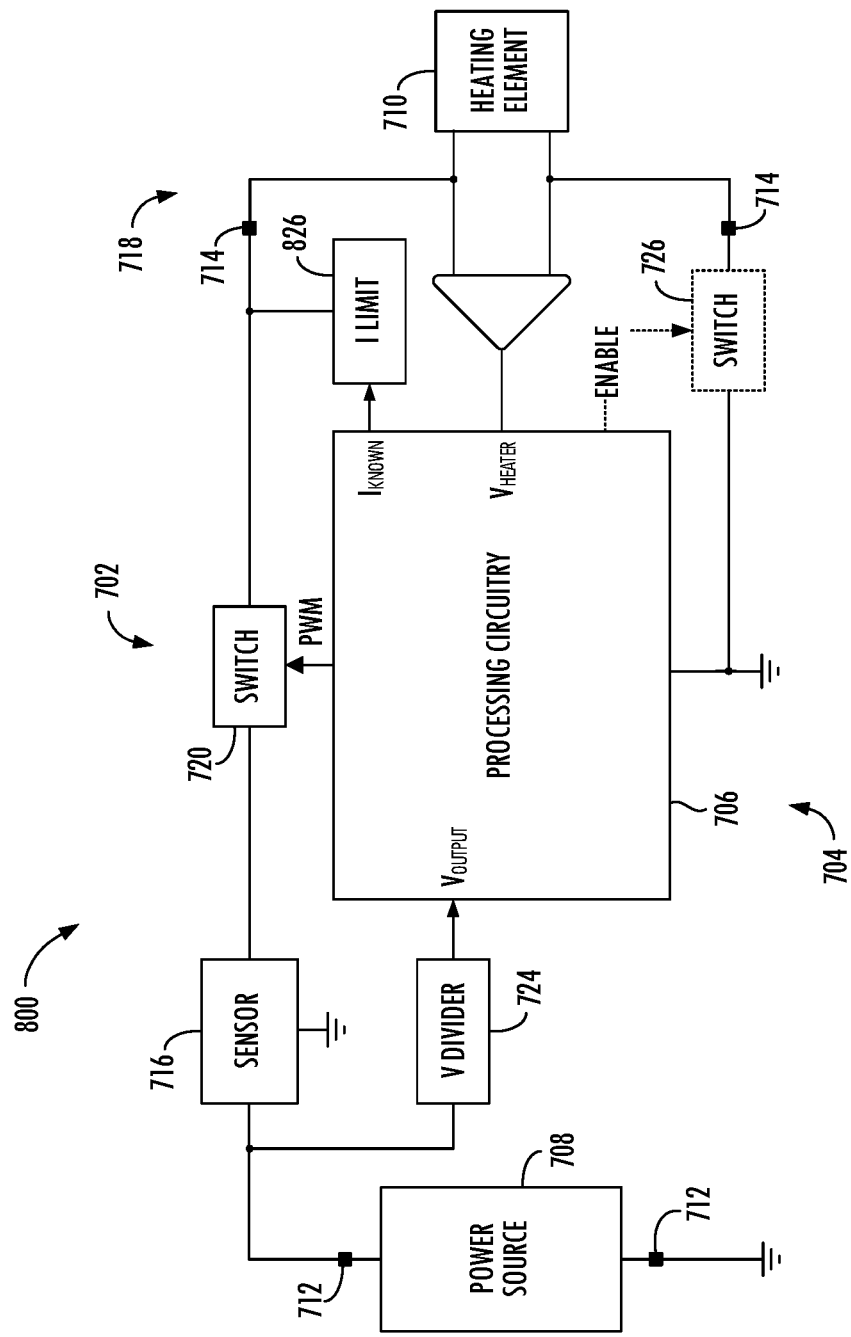
Figure 9:
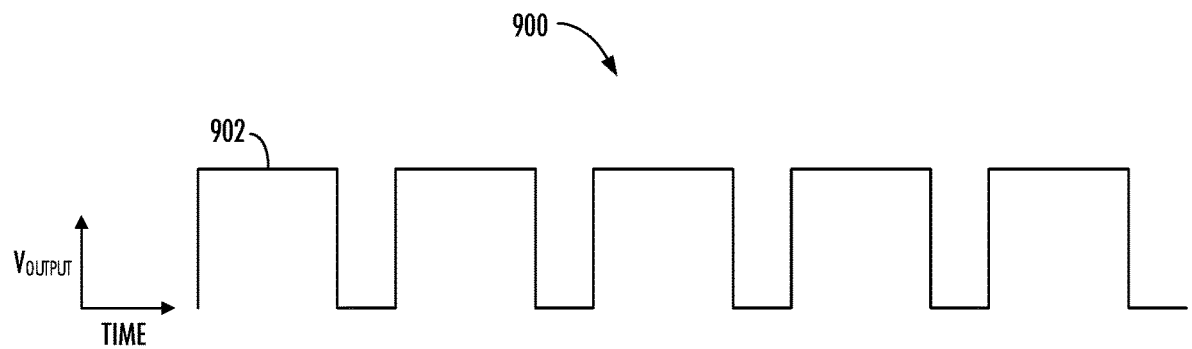
Figure 10:
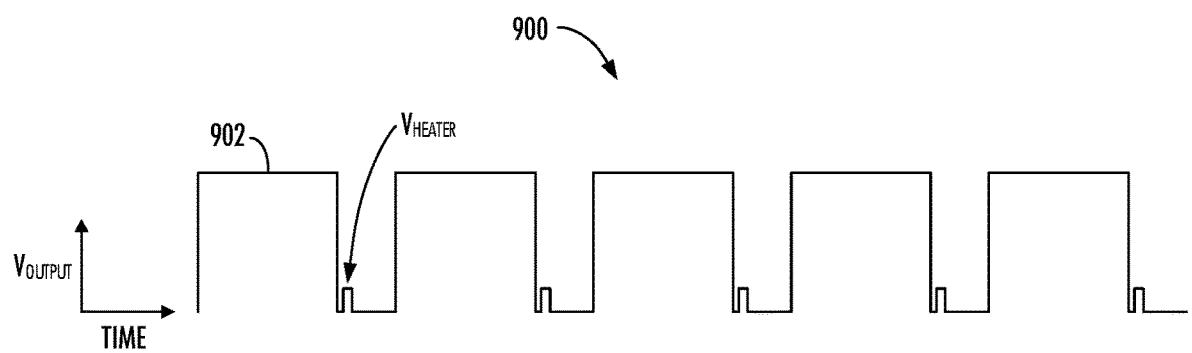
Figure 11:
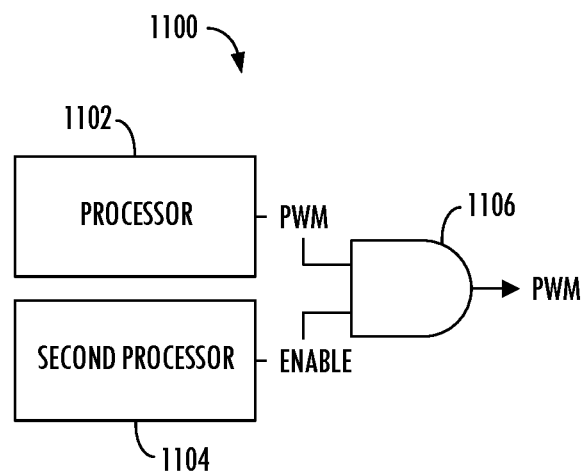
Figure 12:
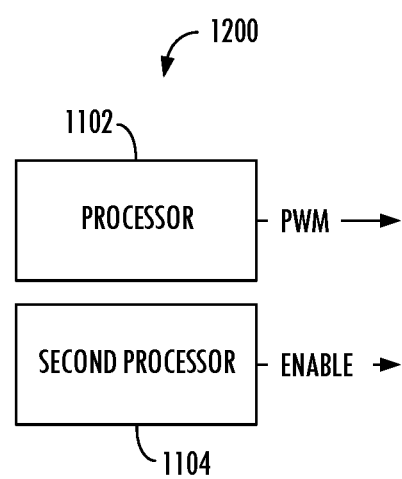
Figure 13:
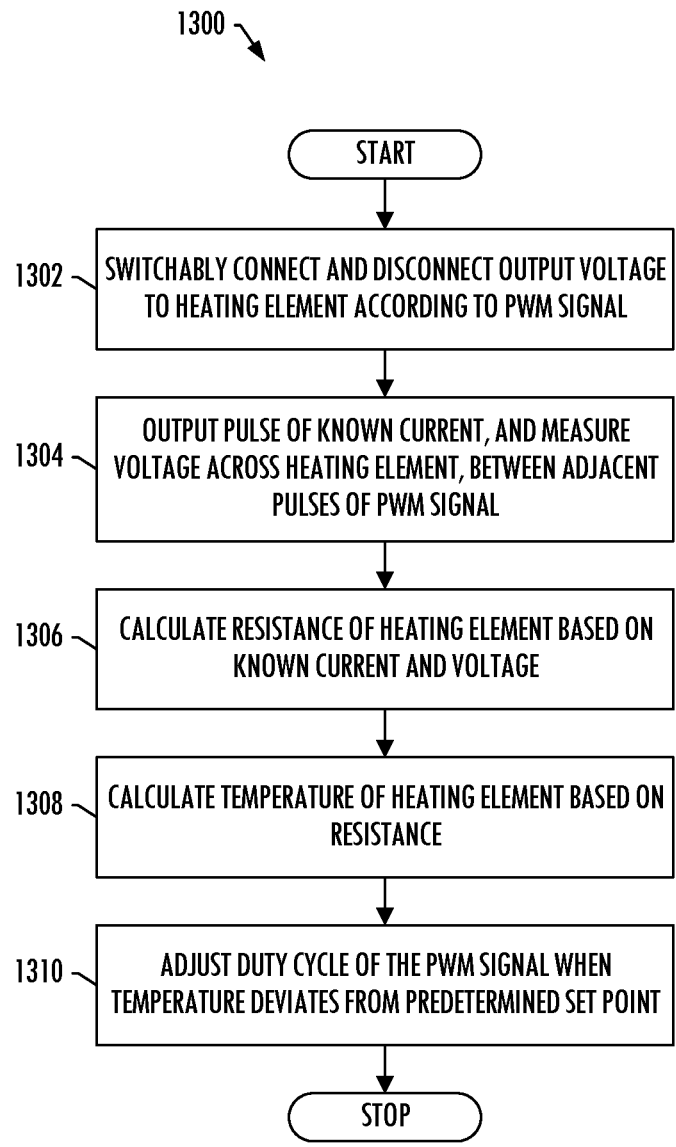
Figure 14:
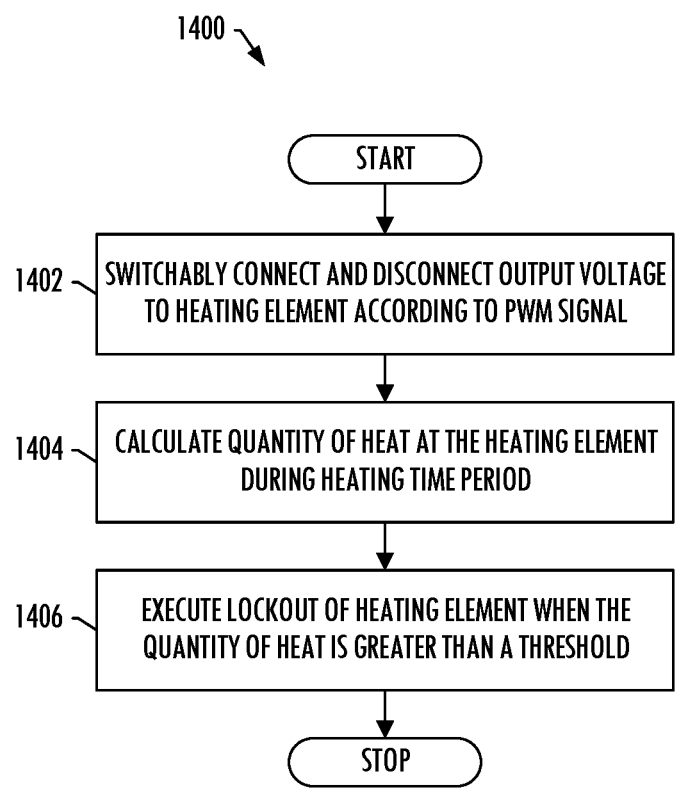

Having thus described aspects of the disclosure in the foregoing general terms, reference will now be made to the accompanying figures, which are not necessarily drawn to scale, and wherein:

FIGS. 1 and 2 illustrate respectively a perspective view and a partially cut-away side view of an aerosol delivery device including a cartridge and a control body that are coupled to one another, according to an example implementation of the present disclosure;

FIGS. 3 and 4 illustrate a perspective view of an aerosol delivery device comprising a control body and an aerosol source member that are respectively coupled to one another and decoupled from one another, according to another example implementation of the present disclosure;

FIGS. 5 and 6 illustrate respectively a front view of and a sectional view through the aerosol delivery device of FIGS. 3 and 4, according to an example implementation;

FIGS. 7 and 8 illustrate circuit diagrams of aerosol delivery devices according to various example implementations of the present disclosure;

FIGS. 9 and 10 illustrate respectively an example pulse-width modulation (PWM) signal according to some examples, and the example PWM signal superimposed with measurements of voltage across a heating element, according to some examples;

FIGS. 11 and 12 illustrate processing circuitry according to various example implementations; and FIGS. 13 and 14 are flowcharts illustrating various operations in methods of controlling an aerosol delivery device, according to various example implementations.

DETAILED DESCRIPTION

The present disclosure will now be described more fully hereinafter with reference to example implementations thereof. These example implementations are described so that this disclosure will be thorough and complete, and will fully convey the scope of the disclosure to those skilled in the art. Indeed, the disclosure may be embodied in many different forms and should not be construed as limited to the implementations set forth herein; rather, these implementations are provided so that this disclosure will satisfy applicable legal requirements. As used in the specification and the appended claims, the singular forms "a," "an," "the" and the like include plural referents unless the context clearly dictates otherwise. Also, while reference may be made herein to quantitative measures, values, geometric relationships or the like, unless otherwise stated, any one or more if not all of these may be absolute or approximate to account for acceptable variations that may occur, such as those due to engineering tolerances or the like.

As described hereinafter, the present disclosure relates to aerosol delivery devices. Aerosol delivery devices may be configured to produce an aerosol (an inhalable substance) from an aerosol precursor composition (sometimes referred to as an inhalable substance medium). The aerosol precursor composition may comprise one or more of a solid tobacco material, a semi-solid tobacco material, or a liquid aerosol precursor composition. In some implementations, the aerosol delivery devices may be configured to heat and produce an aerosol from a fluid aerosol precursor composition (e.g., a liquid aerosol precursor composition). Such aerosol delivery devices may include so-called electronic cigarettes. In other implementations, the aerosol delivery devices may comprise heat-not-burn devices. In yet other implementations, the aerosol delivery devices may comprise no-heat-no-burn devices.

Liquid aerosol precursor composition, also referred to as a vapor precursor composition or "e-liquid," is particularly useful for electronic cigarettes and no-heat-no-burn devices, as well as other devices that atomize or otherwise aerosolize a liquid to generate an inhalable aerosol. Liquid aerosol precursor composition may comprise a variety of components including, by way of example, a polyhydric alcohol (e.g., glycerin (including vegetable glycerin), propylene glycol, or a mixture thereof), nicotine, tobacco, tobacco extract, and/or flavorants. In some examples, the aerosol precursor composition comprises glycerin and nicotine.

Some liquid aerosol precursor compositions that may be used in conjunction with various implementations may include one or more acids such as levulinic acid, succinic acid, lactic acid, pyruvic acid, benzoic acid, fumaric acid, combinations thereof, and the like. Inclusion of an acid(s) in liquid aerosol precursor compositions including nicotine may provide a protonated liquid aerosol precursor composition, including nicotine in salt form. Representative types of liquid aerosol precursor components and formulations are set forth and characterized in U.S. Pat. No. 7,726,320 to Robinson et al.; U.S. Pat. No. 9,254,002 to Chong et al.; and U.S. Pat. App. Pub. Nos. 2013/0008457 to Zheng et al., 2015/0020823 to Lipowicz et al., and 2015/0020830 to Koller; as well as PCT Pat. App. Pub. No. WO 2014/182736 to Bowen et al.; and U.S. Pat. No. 8,881,737 to Collett et al., the disclosures of which are incorporated herein by reference. Other aerosol precursors that may be employed include the aerosol precursors that have been incorporated in any of a number of the representative products identified above. Also desirable are the so-called "smoke juices" for electronic cigarettes that have been available from Johnson Creek Enterprises LLC. Still further example aerosol precursor compositions are sold under the brand names BLACK NOTE, COSMIC FOG, THE MILKMAN E-LIQUID, FIVE PAWNS, THE VAPOR CHEF, VAPE WILD, BOOSTED, THE STEAM FACTORY, MECH SAUCE, CASEY JONES MAINLINE RESERVE, MITTEN VAPORS, DR. CRIMMY'S V-LIQUID, SMILEY E LIQUID, BEANTOWN VAPOR, CUTTWOOD, CYCLOPS VAPOR, SICBOY, GOOD LIFE VAPOR, TELEOS, PINUP VAPORS, SPACE JAM, MT. BAKER VAPOR, and JIMMY THE JUICE MAN. Implementations of effervescent materials can be used with the aerosol precursor, and are described, by way of example, in U.S. Pat. App. Pub. No. 2012/0055494 to Hunt et al., which is incorporated herein by reference. Further, the use of effervescent materials is described, for example, in U.S. Pat. No. 4,639,368 to Niazi et al.; U.S. Pat. No. 5,178,878 to Wehling et al.; U.S. Pat. No. 5,223,264 to Wehling et al.; U.S. Pat. No. 6,974,590 to Pather et al.; U.S. Pat. No. 7,381,667 to Bergquist et al.; U.S. Pat. No. 8,424,541 to Crawford et al.; U.S. Pat. No. 8,627,828 to Strickland et al.; and U.S. Pat. No. 9,307,787 to Sun et al.; as well as U.S. Pat. App. Pub. Nos. 2010/0018539 to Brinkley et al., and PCT Pat. App. Pub. No. WO 97/06786 to Johnson et al., all of which are incorporated by reference herein.

The aerosol precursor composition may additionally or alternatively include other active ingredients including, but not limited to, botanical ingredients (e.g., lavender, peppermint, chamomile, basil, rosemary, thyme, eucalyptus, ginger, cannabis, ginseng, maca, and tisanes), stimulants (e.g., caffeine and guarana), amino acids (e.g., taurine, theanine, phenylalanine, tyrosine, and tryptophan) and/or pharmaceutical, nutraceutical, and medicinal ingredients (e.g., vitamins, such as B6, B12, and C and cannabinoids, such as tetrahydrocannabinol (THC) and cannabidiol (CBD)).

Representative types of substrates, reservoirs or other components for supporting the aerosol precursor are described in U.S. Pat. No. 8,528,569 to Newton; U.S. Pat. App. Pub. No. 2014/0261487 to Chapman et al.; U.S. Pat.

App. Pub. No. 2015/0059780 to Davis et al.; and U.S. Pat. App. Pub. No. 2015/0216232 to Bless et al., all of which are incorporated herein by reference. Additionally, various wicking materials, and the configuration and operation of those wicking materials within certain types of electronic cigarettes, are set forth in U.S. Pat. No. 8,910,640 to Sears et al., which is incorporated herein by reference.

In other implementations, the aerosol delivery devices may comprise heat-not-burn devices, configured to heat a solid aerosol precursor composition (e.g., an extruded tobacco rod) or a semi-solid aerosol precursor composition (e.g., a glycerin-loaded tobacco paste). The aerosol precursor composition may comprise tobacco-containing beads, tobacco shreds, tobacco strips, reconstituted tobacco material, or combinations thereof, and/or a mix of finely ground tobacco, tobacco extract, spray dried tobacco extract, or other tobacco form mixed with optional inorganic materials (such as calcium carbonate), optional flavors, and aerosol forming materials to form a substantially solid or moldable (e.g., extrudable) substrate. Representative types of solid and semi-solid aerosol precursor compositions and formulations are disclosed in U.S. Pat. No. 8,424,538 to Thomas et al.; U.S. Pat. No. 8,464,726 to Sebastian et al.; U.S. Pat. App. Pub. No. 2015/0083150 to Conner et al.; U.S. Pat. App. Pub. No. 2015/0157052 to Ademe et al.; and U.S. Pat. App. Pub. No. 2017/0000188 to Nordskog et al., all of which are incorporated by reference herein. Further representative types of solid and semi-solid aerosol precursor compositions and arrangements include those found in the NEOSTIKS™ consumable aerosol source members for the GLO™ product by British American Tobacco and in the HEETS™ consumable aerosol source members for the IQOS™ product by Philip Morris International. Inc.

In various implementations, the inhalable substance specifically may be a tobacco component or a tobacco-derived material (i.e., a material that is found naturally in tobacco that may be isolated directly from the tobacco or synthetically prepared). For example, the aerosol precursor composition may comprise tobacco extracts or fractions thereof combined with an inert substrate. The aerosol precursor composition may further comprise unburned tobacco or a composition containing unburned tobacco that, when heated to a temperature below its combustion temperature, releases an inhalable substance. In some implementations, the aerosol precursor composition may comprise tobacco condensates or fractions thereof (i.e., condensed components of the smoke produced by the combustion of tobacco, leaving flavors and, possibly, nicotine).

Tobacco materials useful in the present disclosure can vary and may include, for example, flue-cured tobacco, burley tobacco, Oriental tobacco or Maryland tobacco, dark tobacco, dark-fired tobacco and Rustica tobaccos, as well as other rare or specialty tobaccos, or blends thereof. Tobacco materials also can include so-called "blended" forms and processed forms, such as processed tobacco stems (e.g., cut-rolled or cut-puffed stems), volume expanded tobacco (e.g., puffed tobacco, such as dry ice expanded tobacco (DIET), preferably in cut filler form), reconstituted tobaccos (e.g., reconstituted tobaccos manufactured using paper-making type or cast sheet type processes). Various representative tobacco types, processed types of tobaccos, and types of tobacco blends are set forth in U.S. Pat. No. 4,836,224 to Lawson et al., U.S. Pat. No. 4,924,888 to Perfetti et al., U.S. Pat. No. 5,056,537 to Brown et al., U.S. Pat. No. 5,159,942 to Brinkley et al., U.S. Pat. No. 5,220,930 to Gentry, U.S. Pat. No. 5,360,023 to Blakley et al., U.S. Pat. No. 6,701,936 to Shafer et al., U.S. Pat. No. 7,011,096 to Li et al., U.S. Pat. No. 7,017,585 to Li et al., and U.S. Pat. No. 7,025,066 to Lawson et al.; U.S. Pat. App. Pub. No. 2004/0255965 to Perfetti et al.; PCT Pat. App. Pub. No. WO 02/37990 to Bereman; and Bombick et al., Fund. Appl. Toxicol., 39, p. 11-17 (1997), which are incorporated herein by reference. Further example tobacco compositions that may be useful in a smoking device, including according to the present disclosure, are disclosed in U.S. Pat. No. 7,726,320 to Robinson et al., which is incorporated herein by reference.

Still further, the aerosol precursor composition may comprise an inert substrate having the inhalable substance, or a precursor thereof, integrated therein or otherwise deposited thereon. For example, a liquid comprising the inhalable substance may be coated on or absorbed or adsorbed into the inert substrate such that, upon application of heat, the inhalable substance is released in a form that can be withdrawn from the inventive article through application of positive or negative pressure. In some aspects, the aerosol precursor composition may comprise a blend of flavorful and aromatic tobaccos in cut filler form. In another aspect, the aerosol precursor composition may comprise a reconstituted tobacco material, such as described in U.S. Pat. No. 4,807,809 to Pryor et al.; U.S. Pat. No. 4,889,143 to Pryor et al.; and U.S. Pat. No. 5,025,814 to Raker, the disclosures of which are incorporated herein by reference. For further information regarding suitable aerosol precursor composition, see U.S. patent application Ser. No. 15/916,834 to Sur et al., filed Mar. 9, 2018, which is incorporated herein by reference.

Regardless of the type of aerosol precursor composition, aerosol delivery devices may include an aerosol production component configured to produce an aerosol from the aerosol precursor composition. In the case of an electronic cigarette or a heat-not-burn device, for example, the aerosol production component may be or include a heating element (at times referred to as a heating member). In the case of a no-heat-no-burn device, in some examples, the aerosol production component may be or include at least one vibratable piezoelectric or piezomagnetic mesh.

One example of a suitable heating element is an induction heater. Such heaters often comprise an induction transmitter and an induction receiver. The induction transmitter may include a coil configured to create an oscillating magnetic field (e.g., a magnetic field that varies periodically with time) when alternating current is directed through it. The induction receiver may be at least partially located or received within the induction transmitter and may include a conductive material (e.g., ferromagnetic material or an aluminum coated material). By directing alternating current through the induction transmitter, eddy currents may be generated in the induction receiver via induction. The eddy currents flowing through the resistance of the material defining the induction receiver may heat it by Joule heating (i.e., through the Joule effect). The induction receiver, which may define an atomizer, may be wirelessly heated to form an aerosol from an aerosol precursor composition positioned in proximity to the induction receiver. Various implementations of an aerosol delivery device with an induction heater are described in U.S. Pat. App. Pub. No. 2017/0127722 to Davis et al.; U.S. Pat. App. Pub. No. 2017/0202266 to Sur et al.; U.S. Pat. App. Pub. No. 2018/0132531 to Sur et al.; U.S. Pat. App. Pub. No. 2019/0124979 to Sebastian et al.; and U.S. Pat. App. Pub. No. 2019/0174823 to Sur, all of which are incorporated by reference herein.

In other implementations including those described more particularly herein, the heating element is a conductive heater such as in the case of electrical resistance heater.

These heaters may be configured to produce heat when an electrical current is directed through it. In various implementations, a conductive heater may be provided in a variety forms, such as in the form of a foil, a foam, a plate, discs, spirals, fibers, wires, films, yarns, strips, ribbons or cylinders. Such heaters often include a metal material and are configured to produce heat as a result of the electrical resistance associated with passing an electrical current through it. Such resistive heaters may be positioned in proximity to and heat an aerosol precursor composition to produce an aerosol. A variety of conductive substrates that may be usable with the present disclosure are described in the above-cited U.S. Pat. App. Pub. No. 2013/0255702 to Griffith et al. Other examples of suitable heaters are described in U.S. Pat. No. 9,491,974 to DePiano et al., which is incorporated by reference herein.

In some implementations aerosol delivery devices may include a control body, sometimes referred to as a power unit or control device. The aerosol delivery devices may also include a cartridge in the case of so-called electronic cigarettes or no-heat-no-burn devices, or an aerosol source member in the case of heat-not-burn devices. In the case of either electronic cigarettes or heat-not-burn devices, the control body may be reusable, whereas the cartridge/aerosol source member may be configured for a limited number of uses and/or configured to be disposable. Various mechanisms may connect the cartridge/aerosol source member to the control body to result in a threaded engagement, a press-fit engagement, an interference fit, a sliding fit, a magnetic engagement, or the like.

The control body and cartridge/aerosol source member may include separate, respective housings or outer bodies, which may be formed of any of a number of different materials. The housing may be formed of any suitable, structurally-sound material. In some examples, the housing may be formed of a metal or alloy, such as stainless steel, aluminum or the like. Other suitable materials include various plastics (e.g., polycarbonate), metal-plating over plastic, ceramics and the like.

The cartridge/aerosol source member may include the aerosol precursor composition. In order to produce aerosol from the aerosol precursor composition, the aerosol production component (e.g., heating element, piezoelectric/piezomagnetic mesh) may be positioned in contact with or proximate the aerosol precursor composition, such as across the control body and cartridge, or in the control body in which the aerosol source member may be positioned. The control body may include a power source, which may be rechargeable or replaceable, and thereby the control body may be reused with multiple cartridges/aerosol source members.

The control body may also include means to activate the aerosol delivery device such as a pushbutton, touch-sensitive surface or the like for manual control of the device. Additionally or alternatively, the control body may include a flow sensor to detect when a user draws on the cartridge/aerosol source member to thereby activate the aerosol delivery device.

In various implementations, the aerosol delivery device according to the present disclosure may have a variety of overall shapes, including, but not limited to an overall shape that may be defined as being substantially rod-like or substantially tubular shaped or substantially cylindrically shaped. In the implementations shown in and described with reference to the accompanying figures, the aerosol delivery device has a substantially round cross-section; however, other cross-sectional shapes (e.g., oval, square, rectangle, triangle, etc.) also are encompassed by the present disclosure. Such language that is descriptive of the physical shape of the article may also be applied to the individual components thereof, including the control body and the cartridge/aerosol source member. In other implementations, the control body may take another handheld shape, such as a small box shape.

In more specific implementations, one or both of the control body and the cartridge/aerosol source member may be referred to as being disposable or as being reusable. For example, the control body may have a power source such as a replaceable battery or a rechargeable battery, SSB, thin-film SSB, rechargeable supercapacitor, lithium-ion or hybrid lithium-ion supercapacitor, or the like. One example of a power source is a TKI-1550 rechargeable lithium-ion battery produced by Tadiran Batteries GmbH of Germany. In another implementation, a useful power source may be a N50-AAA CADNICA nickel-cadmium cell produced by Sanyo Electric Company, Ltd., of Japan. In other implementations, a plurality of such batteries, for example providing 1.2-volts each, may be connected in series.

In some examples, then, the power source may be connected to and thereby combined with any type of recharging technology. Examples of suitable chargers include chargers that simply supply constant or pulsed direct current (DC) power to the power source, fast chargers that add control circuitry, three-stage chargers, induction-powered chargers, smart chargers, motion-powered chargers, pulsed chargers, solar chargers, USB-based chargers and the like. In some examples, the charger includes a power adapter and any suitable charge circuitry. In other examples, the charger includes the power adapter and the control body is equipped with charge circuitry. In these other examples, the charger may at times be simply referred to as a power adapter.

The control body may include any of a number of different terminals, electrical connectors or the like to connect to a suitable charger, and in some examples, to connect to other peripherals for communication. More specific suitable examples include direct current (DC) connectors such as cylindrical connectors, cigarette lighter connectors and USB connectors including those specified by USB 1.x (e.g., Type A, Type B), USB 2.0 and its updates and additions (e.g., Mini A, Mini B, Mini AB, Micro A, Micro B, Micro AB) and USB 3.x (e.g., Type A, Type B, Micro B, Micro AB, Type C), proprietary connectors such as Apple's Lightning connector, and the like. The control body may directly connect with the charger or other peripheral, or the two may connect via an appropriate cable that also has suitable connectors. In examples in which the two are connected by cable, the control body and charger or other peripheral may have the same or different type of connector with the cable having the one type of connector or both types of connectors.

In examples involving induction-powered charging, the aerosol delivery device may be equipped with inductive wireless charging technology and include an induction receiver to connect with a wireless charger, charging pad or the like that includes an induction transmitter and uses inductive wireless charging (including for example, wireless charging according to the Qi wireless charging standard from the Wireless Power Consortium (WPC)). Or the power source may be recharged from a wireless radio frequency (RF) based charger. An example of an inductive wireless charging system is described in U.S. Pat. App. Pub. No. 2017/0112196 to Sur et al., which is incorporated herein by reference in its entirety. Further, in some implementations in the case of an electronic cigarette, the cartridge may comprise a single-use cartridge, as disclosed in U.S. Pat. No. 8,910,639 to Chang et al., which is incorporated herein by reference.

One or more connections may be employed to connect the power source to a recharging technology, and some may involve a charging case, cradle, dock, sleeve or the like. More specifically, for example, the control body may be configured to engage a cradle that includes a USB connector to connect to a power supply. Or in another example, the control body may be configured to fit within and engage a sleeve that includes a USB connector to connect to a power supply. In these and similar examples, the USB connector may connect directly to the power source, or the USB connector may connect to the power source via a suitable power adapter.

Examples of power sources are described in U.S. Pat. No. 9,484,155 to Peckerar et al.; and U.S. Pat. App. Pub. No. 2017/0112191 to Sur et al., filed Oct. 21, 2015, the disclosures of which are incorporated herein by reference. Other examples of a suitable power source are provided in U.S. Pat. App. Pub. No. 2014/0283855 to Hawes et al., U.S. Pat. App. Pub. No. 2014/0014125 to Fernando et al., U.S. Pat. App. Pub. No. 2013/0243410 to Nichols et al., U.S. Pat. App. Pub. No. 2010/0313901 to Fernando et al., and U.S. Pat. No. 9,439,454 to Fernando et al., all of which are incorporated herein by reference. With respect to the flow sensor, representative current regulating components and other current controlling components including various microcontrollers, sensors, and switches for aerosol delivery devices are described in U.S. Pat. No. 4,735,217 to Gerth et al.; U.S. Pat. Nos. 4,922,901, 4,947,874, and 4,947,875, all to Brooks et al.; U.S. Pat. No. 5,372,148 to McCafferty et al.; U.S. Pat. No. 6,040,560 to Fleischhauer et al.; U.S. Pat. No. 7,040,314 to Nguyen et al.; U.S. Pat. No. 8,205,622 to Pan; U.S. Pat. No. 8,881,737 to Collet et al.; U.S. Pat. No. 9,423,152 to Ampolini et al.; U.S. Pat. No. 9,439,454 to Fernando et al.; and U.S. Pat. App. Pub. No. 2015/0257445 to Henry et al., all of which are incorporated herein by reference.

An input device may be included with the aerosol delivery device (and may replace or supplement a flow sensor). The input may be included to allow a user to control functions of the device and/or for output of information to a user. Any component or combination of components may be utilized as an input for controlling the function of the device. Suitable input devices include pushbuttons, touch switches or other touch sensitive surfaces. For example, one or more pushbuttons may be used as described in U.S. Pat. App. Pub. No. 2015/0245658 to Worm et al., which is incorporated herein by reference. Likewise, a touchscreen may be used as described in U.S. Pat. No. 10,172,388 to Sears et al., which is incorporated herein by reference.

As a further example, components adapted for gesture recognition based on specified movements of the aerosol delivery device may be used as an input device. See U.S. Pat App. Pub. 2016/0158782 to Henry et al., which is incorporated herein by reference. As still a further example, a capacitive sensor may be implemented on the aerosol delivery device to enable a user to provide input, such as by touching a surface of the device on which the capacitive sensor is implemented. In another example, a sensor capable of detecting a motion associated with the device (e.g., accelerometer, gyroscope, photoelectric proximity sensor, etc.) may be implemented on the aerosol delivery device to enable a user to provide input. Examples of suitable sensors are described in U.S. Pat. App. Pub. No. 2018/0132528 to Sur et al.; and U.S. Pat. App. Pub. No. 2016/0158782 to Henry et al., which are incorporated herein by reference.

As indicated above, the aerosol delivery device may include various electronics such as at least one control component. A suitable control component may include a number of electronic components, and in some examples may be formed of a circuit board such as a printed circuit board (PCB). In some examples, the electronic components include processing circuitry configured to perform data processing, application execution, or other processing, control or management services according to one or more example implementations. The processing circuitry may include a processor embodied in a variety of forms such as at least one processor core, microprocessor, coprocessor, controller, microcontroller or various other computing or processing devices including one or more integrated circuits such as, for example, an ASIC (application specific integrated circuit), an FPGA (field programmable gate array), some combination thereof, or the like. In some examples, the processing circuitry may include memory coupled to or integrated with the processor, and which may store data, computer program instructions executable by the processor, some combination thereof, or the like.

In some examples, the control component may include one or more input/output peripherals, which may be coupled to or integrated with the processing circuitry. More particularly, the control component may include a communication interface to enable wireless communication with one or more networks, computing devices or other appropriately-enabled devices. Examples of suitable communication interfaces are disclosed in U.S. Pat. App. Pub. No. 2016/0261020 to Marion et al., the content of which is incorporated herein by reference. Another example of a suitable communication interface is the CC3200 single chip wireless microcontroller unit (MCU) from Texas Instruments. And examples of suitable manners according to which the aerosol delivery device may be configured to wirelessly communicate are disclosed in U.S. Pat. App. Pub. No. 2016/0007651 to Ampolini et al.; and U.S. Pat. App. Pub. No. 2016/0219933 to Henry, Jr. et al., each of which is incorporated herein by reference.

Still further components can be utilized in the aerosol delivery device of the present disclosure. One example of a suitable component is a light source such as light-emitting diodes (LEDs), quantum dot-based LEDs or the like, which may be illuminated with use of the aerosol delivery device. Examples of suitable LED components, and the configurations and uses thereof, are described in U.S. Pat. No. 5,154,192 to Sprinkel et al.; U.S. Pat. No. 8,499,766 to Newton; U.S. Pat. No. 8,539,959 to Scatterday; and U.S. Pat. No. 9,451,791 to Sears et al., all of which are incorporated herein by reference.

Other indices of operation are also encompassed by the present disclosure. For example, visual indicators of operation also include changes in light color or intensity to show progression of the smoking experience. Tactile (haptic) indicators of operation such as vibration motors, and sound (audio) indicators of operation such as speakers, are similarly encompassed by the disclosure. Moreover, combinations of such indicators of operation also are suitable to be used in a single smoking article. According to another aspect, the aerosol delivery device may include one or more indicators or indicia, such as, for example, a display configured to provide information corresponding to the operation of the smoking article such as, for example, the amount of power remaining in the power source, progression of the smoking experience, indication corresponding to activating an aerosol production component, and/or the like.

Yet other components are also contemplated. For example, U.S. Pat. No. 5,154,192 to Sprinkel et al. discloses indicators for smoking articles; U.S. Pat. No. 5,261,424 to Sprinkel, Jr. discloses piezoelectric sensors that can be associated with the mouth-end of a device to detect user lip activity associated with taking a draw and then trigger heating of a heating device; U.S. Pat. No. 5,372,148 to McCafferty et al. discloses a puff sensor for controlling energy flow into a heating load array in response to pressure drop through a mouthpiece; U.S. Pat. No. 5,967,148 to Harris et al. discloses receptacles in a smoking device that include an identifier that detects a non-uniformity in infrared transmissivity of an inserted component and a controller that executes a detection routine as the component is inserted into the receptacle; U.S. Pat. No. 6,040,560 to Fleischhauer et al. describes a defined executable power cycle with multiple differential phases; U.S. Pat. No. 5,934,289 to Watkins et al. discloses photonic-optronic components; U.S. Pat. No. 5,954,979 to Counts et al. discloses means for altering draw resistance through a smoking device; U.S. Pat. No. 6,803,545 to Blake et al. discloses specific battery configurations for use in smoking devices; U.S. Pat. No. 7,293,565 to Griffen et al. discloses various charging systems for use with smoking devices; U.S. Pat. No. 8,402,976 to Fernando et al. discloses computer interfacing means for smoking devices to facilitate charging and allow computer control of the device; U.S. Pat. No. 8,689,804 to Fernando et al. discloses identification systems for smoking devices; and PCT Pat. App. Pub. No. WO 2010/003480 by Flick discloses a fluid flow sensing system indicative of a puff in an aerosol generating system; all of the foregoing disclosures being incorporated herein by reference.

Further examples of components related to electronic aerosol delivery articles and disclosing materials or components that may be used in the present article include U.S. Pat. No. 4,735,217 to Gerth et al.; U.S. Pat. No. 5,249,586 to Morgan et al.; U.S. Pat. No. 5,666,977 to Higgins et al.; U.S. Pat. No. 6,053,176 to Adams et al.; U.S. Pat. No. 6,164,287 to White; U.S. Pat. No. 6,196,218 to Voges; U.S. Pat. No. 6,810,883 to Felter et al.; U.S. Pat. No. 6,854,461 to Nichols; U.S. Pat. No. 7,832,410 to Hon; U.S. Pat. No. 7,513,253 to Kobayashi; U.S. Pat. No. 7,896,006 to Hamano; U.S. Pat. No. 6,772,756 to Shayan; U.S. Pat. Nos. 8,156,944 and 8,375,957 to Hon; U.S. Pat. No. 8,794,231 to Thorens et al.; U.S. Pat. No. 8,851,083 to Oglesby et al.; U.S. Pat. Nos. 8,915,254 and 8,925,555 to Monsees et al.; U.S. Pat. No. 9,220,302 to DePiano et al.; U.S. Pat. App. Pub. Nos. 2006/0196518 and 2009/0188490 to Hon; U.S. Pat. App. Pub. No. 2010/0024834 to Oglesby et al.; U.S. Pat. App. Pub. No. 2010/0307518 to Wang; PCT Pat. App. Pub. No. WO 2010/091593 to Hon; and PCT Pat. App. Pub. No. WO 2013/089551 to Foo, each of which is incorporated herein by reference. Further, U.S. Pat. App. Pub. No. 2017/0099877 to Worm et al., discloses capsules that may be included in aerosol delivery devices and fob-shape configurations for aerosol delivery devices, and is incorporated herein by reference. A variety of the materials disclosed by the foregoing documents may be incorporated into the present devices in various implementations, and all of the foregoing disclosures are incorporated herein by reference.

Yet other features, controls or components that can be incorporated into aerosol delivery devices of the present disclosure are described in U.S. Pat. No. 5,967,148 to Harris et al.; U.S. Pat. No. 5,934,289 to Watkins et al.; U.S. Pat. No. 5,954,979 to Counts et al.; U.S. Pat. No. 6,040,560 to Fleischhauer et al.; U.S. Pat. No. 8,365,742 to Hon; U.S. Pat. No. 8,402,976 to Fernando et al.; U.S. Pat. App. Pub. No. 2005/0016550 to Katase; U.S. Pat. No. 8,689,804 to Fernando et al.; U.S. Pat. App. Pub. No. 2013/0192623 to Tucker et al.; U.S. Pat. No. 9,427,022 to Leven et al.; U.S. Pat. App. Pub. No. 2013/0180553 to Kim et al.; U.S. Pat. App. Pub. No. 2014/0000638 to Sebastian et al.; U.S. Pat. App. Pub. No. 2014/0261495 to Novak et al.; and U.S. Pat. No. 9,220,302 to DePiano et al., all of which are incorporated herein by reference.

FIGS. 1 and 2 illustrate implementations of an aerosol delivery device including a control body and a cartridge in the case of an electronic cigarette. In this regard, FIGS. 1 and 2 illustrate an aerosol delivery device 100 according to an example implementation of the present disclosure. As indicated, the aerosol delivery device may include a control body 102 (also referred to as a power unit) and a cartridge 104. The control body and the cartridge can be permanently or detachably aligned in a functioning relationship. FIGS. 1 and 2 illustrate respectively a perspective view and a partially cut-away side view of the aerosol delivery device in a coupled configuration.

The control body 102 and the cartridge 104 can be configured to engage one another by a variety of connections, such as a press fit (or interference fit) connection, a threaded connection, a magnetic connection, or the like. As such, the control body may include a first engaging element (e.g., a coupler) that is adapted to engage a second engaging element (e.g., a connector) on the cartridge. The first engaging element and the second engaging element may be reversible. As an example, either of the first engaging element or the second engaging element may be a male thread, and the other may be a female thread. As a further example, either the first engaging element or the second engaging element may be a magnet, and the other may be a metal or a matching magnet.

In particular implementations, engaging elements may be defined directly by existing components of the control body 102 and the cartridge 104. For example, the housing of the control body may define a cavity at an end thereof that is configured to receive at least a portion of the cartridge (e.g., a storage tank or other shell-forming element of the cartridge). In particular, a storage tank of the cartridge may be at least partially received within the cavity of the control body while a mouthpiece of the cartridge remains exposed outside of the cavity of the control body. The cartridge may be retained within the cavity formed by the control body housing, such as by an interference fit (e.g., through use of detents and/or other features creating an interference engagement between an outer surface of the cartridge and an interior surface of a wall forming the control body cavity), by a magnetic engagement (e.g., though use of magnets and/or magnetic metals positioned within the cavity of the control body and positioned on the cartridge), or by other suitable techniques.

As also shown in FIG. 1, the aerosol delivery device 100 may include an indication window 106 defined on an outer housing of the control body 102, and through which a user may be provided with a visual indication 108 associated with a distinctive characteristic of the cartridge 104. Additionally or alternatively, the control body may include at least one aperture 110 defined on the outer housing of the control body, and through which light from a light source (see FIG. 2) may be visible.

As seen in the cut-away view illustrated in FIG. 2, the control body 102 and cartridge 104 each include a number of respective components. The components illustrated in FIG. 2 are representative of the components that may be present in a control body and cartridge and are not intended to limit the scope of components that are encompassed by the present disclosure. As shown, for example, the control body can be formed of a housing 206 (sometimes referred to as a control body shell) that can include a control component 208 (e.g., processing circuitry, etc.), a flow sensor 210, a power source 212 (e.g., battery, supercapacitor), and a light source 214 (e.g., LED, quantum dot-based LED), and such components can be variably aligned. The power source may be rechargeable, and the control body may include charging circuitry coupled to and configured to controllably charge the power source.

The control body 102 also includes a cartridge receiving chamber 216, and the cartridge may be configured to be removably coupled with the cartridge receiving chamber. The control body may include electrical connectors 218 positioned in the cartridge receiving chamber configured to electrically couple the control body with the cartridge, and in particular electrical contacts 220 on the cartridge. In this regard, the electrical connectors and electrical contacts may form a connection interface of the control body and cartridge. As also shown, the control body may include an external electrical connector 222 to connect the control body with one or more external devices. Examples of suitable external electrical connectors include USB connectors such as those described above, proprietary connectors such as Apple's Lightning connector, and the like.

In various examples, the cartridge 104 includes a tank portion and a mouthpiece portion. The cartridge, tank portion and/or mouthpiece portion may be separately defined in relation to a longitudinal axis (L), a first transverse axis (T1) that is perpendicular to the longitudinal axis, and a second transverse axis (T2) that is perpendicular to the longitudinal axis and is perpendicular to the first transverse axis. The cartridge can be formed of a housing 224 (sometimes referred to as the cartridge shell) enclosing a reservoir 226 (in the tank portion) configured to retain the aerosol precursor composition, and including a heating element 228 (aerosol production component). In some examples, the electrical connectors 218 on the control body 102 and electrical contacts 220 on the cartridge may electrically connect the heating element with the control component 208 and/or power source 212 of the cartridge. In various configurations, the structure of the cartridge may be referred to as a tank; and accordingly, the terms "cartridge," "tank" and the like may be used interchangeably to refer to a shell or other housing enclosing a reservoir for aerosol precursor composition, and including a heating element.

As shown, in some examples, the reservoir 226 may be in fluid communication with a liquid transport element 230 adapted to wick or otherwise transport an aerosol precursor composition stored in the reservoir housing to the heating element 228. At least a portion of the liquid transport element may be positioned proximate (e.g., directly adjacent, adjacent, in close proximity to, or in relatively close proximity to) the heating element. The liquid transport element may extend between the heating element and the aerosol precursor composition stored in the reservoir 226, and at least a portion of the heating element may be located above a proximal end the reservoir. For the purposes of the present disclosure, it should be understood that the term "above" in this particular context should be interpreted as meaning toward a proximal end of the reservoir and/or the cartridge 104 in direction substantially along the longitudinal axis (L). Other arrangements of the liquid transport element are also contemplated within the scope of the disclosure. For example, in some example implementations, the liquid transport element may be positioned proximate a distal end of the reservoir and/or arranged transverse to the longitudinal axis (L). For further examples of suitable arrangements, see U.S. patent application Ser. No. 16/598,505 to Novak et al., filed Oct. 10, 2019, which is incorporated herein by reference.

The heating element 228 and liquid transport element 230 may be configured as separate elements that are fluidly connected, the heating element and liquid transport element or may be configured as a combined element. For example, in some implementations a heating element may be integrated into a liquid transport element. Some examples of such components are described in U.S. Pat. No. 8,833,364 to Buchberger and U.S. Pat. App. Pub. No. 2017/0203057 to Buchberger, which are incorporated herein by reference. Moreover, the heating element and the liquid transport element may be formed of any construction as otherwise described herein. In some examples, a valve may be positioned between the reservoir 226 and heating element, and configured to control an amount of aerosol precursor composition passed or delivered from the reservoir to the heating element.

Various examples of materials configured to produce heat when electrical current is applied therethrough may be employed to form the heating element 228. The heating element in these examples may be a resistive heating element such as a wire coil, flat plate, micro heater or the like. Example materials from which the heating element may be formed include Kanthal (FeCrAl), nichrome, nickel, stainless steel, indium tin oxide, tungsten, molybdenum disilicide ($MoSi_2$), molybdenum silicide (MoSi), molybdenum disilicide doped with aluminum ($Mo(Si,Al)_2$), titanium, platinum, silver, palladium, alloys of silver and palladium, graphite and graphite-based materials (e.g., carbon-based foams and yarns), conductive inks, boron doped silica, and ceramics (e.g., positive or negative temperature coefficient ceramics). The heating element may be resistive heating element or a heating element configured to generate heat through induction. The heating element may be coated by heat conductive ceramics such as aluminum nitride, silicon carbide, beryllium oxide, alumina, silicon nitride, or their composites. Example implementations of heating elements useful in aerosol delivery devices according to the present disclosure are further described below, and can be incorporated into devices such as those described herein.

An opening 232 may be present in the housing 224 (e.g., at the mouth end of the mouthpiece portion) to allow for egress of formed aerosol from the cartridge 104.

The cartridge 104 also may include one or more electronic components, which may include an integrated circuit, a memory component (e.g., EEPROM, flash memory), a sensor, or the like. The electronic components may be adapted to communicate with the control component 208 and/or with an external device by wired or wireless means. The electronic components may be positioned anywhere within the cartridge.

As indicated above, the control component 208 of the control body 102 may include a number of electronic components, and in some examples may be formed of a circuit board such as a PCB that supports and electrically connects the electronic components. The flow sensor 210 may be one of these electronic components or otherwise positioned on the circuit board. In some examples, the air flow sensor may comprise its own circuit board or other base element to which it can be attached. In some examples, a flexible circuit board may be utilized. A flexible circuit board may be configured into a variety of shapes. In some examples, a flexible circuit board may be combined with, layered onto, or form part or all of a heater substrate.

The reservoir 226 illustrated in FIG. 2 can be a container or can be a fibrous reservoir, as presently described. For example, the reservoir can comprise one or more layers of nonwoven fibers substantially formed into the shape of a tube encircling the interior of the housing 224, in this example. An aerosol precursor composition can be retained in the reservoir. Liquid components, for example, can be sorptively retained by the reservoir. The reservoir can be in fluid connection with the liquid transport element 230. The liquid transport element can transport the aerosol precursor composition stored in the reservoir via capillary action—or via a micro pump—to the heating element 228 that is in the form of a metal wire coil in this example. As such, the heating element is in a heating arrangement with the liquid transport element.

In some examples, a microfluidic chip may be embedded in the reservoir 226, and the amount and/or mass of aerosol precursor composition delivered from the reservoir may be controlled by a micro pump, such as one based on microelectromechanical systems (MEMS) technology. Other example implementations of reservoirs and transport elements useful in aerosol delivery devices according to the present disclosure are further described herein, and such reservoirs and/or transport elements can be incorporated into devices such as those described herein. In particular, specific combinations of heating elements and transport elements as further described herein may be incorporated into devices such as those described herein.

In use, when a user draws on the aerosol delivery device 100, airflow is detected by the flow sensor 210, and the heating element 228 is activated to vaporize components of the aerosol precursor composition. Drawing upon the mouth end of the aerosol delivery device causes ambient air to enter and pass through the aerosol delivery device. In the cartridge 104, the drawn air combines with the formed vapor to form an aerosol. The aerosol is whisked, aspirated or otherwise drawn away from the heating element and out the opening 232 in the mouth end of the aerosol delivery device.

For further detail regarding implementations of an aerosol delivery device including a control body and a cartridge in the case of an electronic cigarette, see the above-cited U.S. patent application Ser. No. 15/836,086 to Sur; and U.S. patent application Ser. No. 15/916,834 to Sur et al.; as well as U.S. patent application Ser. No. 15/916,696 to Sur, filed Mar. 9, 2018; and U.S. patent application Ser. No. 16/171,920 to Aller et al., filed Oct. 26, 2018, all of which are also incorporated herein by reference.

FIGS. 3-6 illustrate implementations of an aerosol delivery device including a control body and an aerosol source member in the case of a heat-not-burn device. More specifically, FIG. 3 illustrates an aerosol delivery device 300 according to an example implementation of the present disclosure. The aerosol delivery device may include a control body 302 and an aerosol source member 304. In various implementations, the aerosol source member and the control body can be permanently or detachably aligned in a functioning relationship. In this regard, FIG. 3 illustrates the aerosol delivery device in a coupled configuration, whereas FIG. 4 illustrates the aerosol delivery device in a decoupled configuration.

As shown in FIG. 4, in various implementations of the present disclosure, the aerosol source member 304 may comprise a heated end 406, which is configured to be inserted into the control body 302, and a mouth end 408, upon which a user draws to create the aerosol. In various implementations, at least a portion of the heated end may include an aerosol precursor composition 410.

In various implementations, the aerosol source member 304, or a portion thereof, may be wrapped in an exterior overwrap material 412, which may be formed of any material useful for providing additional structure and/or support for the aerosol source member. In various implementations, the exterior overwrap material may comprise a material that resists transfer of heat, which may include a paper or other fibrous material, such as a cellulose material. The exterior overwrap material may also include at least one filler material imbedded or dispersed within the fibrous material. In various implementations, the filler material may have the form of water insoluble particles. Additionally, the filler material may incorporate inorganic components. In various implementations, the exterior overwrap may be formed of multiple layers, such as an underlying, bulk layer and an overlying layer, such as a typical wrapping paper in a cigarette. Such materials may include, for example, lightweight "rag fibers" such as flax, hemp, sisal, rice straw, and/or esparto. The exterior overwrap may also include a material typically used in a filter element of a conventional cigarette, such as cellulose acetate. Further, an excess length of the overwrap at the mouth end 408 of the aerosol source member may function to simply separate the aerosol precursor composition 410 from the mouth of a consumer or to provide space for positioning of a filter material, as described below, or to affect draw on the article or to affect flow characteristics of the vapor or aerosol leaving the device during draw. Further discussion relating to the configurations for overwrap materials that may be used with the present disclosure may be found in the above-cited U.S. Pat. No. 9,078,473 to Worm et al.

In various implementations other components may exist between the aerosol precursor composition 410 and the mouth end 408 of the aerosol source member 304, wherein the mouth end may include a filter 414, which may, for example, be made of a cellulose acetate or polypropylene material. The filter may additionally or alternatively contain strands of tobacco containing material, such as described in U.S. Pat. No. 5,025,814 to Raker et al., which is incorporated herein by reference in its entirety. In various implementations, the filter may increase the structural integrity of the mouth end of the aerosol source member, and/or provide filtering capacity, if desired, and/or provide resistance to draw. In some implementations one or any combination of the following may be positioned between the aerosol precursor composition and the mouth end: an air gap; phase change materials for cooling air; flavor releasing media; ion exchange fibers capable of selective chemical adsorption; aerogel particles as filter medium; and other suitable materials.

Various implementations of the present disclosure employ one or more conductive heating elements to heat the aerosol precursor composition 410 of the aerosol source member 304. In various implementations, the heating element may be provided in a variety forms, such as in the form of a foil, a foam, a mesh, a hollow ball, a half ball, discs, spirals, fibers, wires, films, yarns, strips, ribbons, or cylinders. Such heating elements often comprise a metal material and are configured to produce heat as a result of the electrical resistance associated with passing an electrical current therethrough. Such resistive heating elements may be positioned in direct contact with, or in proximity to, the aerosol source member and particularly, the aerosol precursor composition of the aerosol source member. The heating element may be located in the control body and/or the aerosol source member. In various implementations, the aerosol precursor composition may include components (i.e., heat conducting constituents) that are imbedded in, or otherwise part of, the substrate portion that may serve as, or facilitate the function of, the heating assembly. Some examples of various heating members and elements are described in U.S. Pat. No. 9,078,473 to Worm et al.

Some non-limiting examples of various heating element configurations include configurations in which a heating element is placed in proximity with the aerosol source member 304. For instance, in some examples, at least a portion of a heating element may surround at least a portion of an aerosol source member. In other examples, one or more heating elements may be positioned adjacent an exterior of an aerosol source member when inserted in the control body 302. In other examples, at least a portion of a heating element may penetrate at least a portion of an aerosol source member (such as, for example, one or more prongs and/or spikes that penetrate an aerosol source member), when the aerosol source member is inserted into the control body. In some instances, the aerosol precursor composition may include a structure in contact with, or a plurality of beads or particles imbedded in, or otherwise part of, the aerosol precursor composition that may serve as, or facilitate the function of the heating element.

FIG. 5 illustrates a front view of an aerosol delivery device 300 according to an example implementation of the present disclosure, and FIG. 6 illustrates a sectional view through the aerosol delivery device of FIG. 5. In particular, the control body 302 of the depicted implementation may comprise a housing 516 that includes an opening 518 defined in an engaging end thereof, a flow sensor 520 (e.g., a puff sensor or pressure switch), a control component 522 (e.g., processing circuitry, etc.), a power source 524 (e.g., battery, supercapacitor), and an end cap that includes an light source 526 (e.g., a LED). The power source may be rechargeable, and the control body may include charging circuitry coupled to and configured to controllably charge the power source.

In one implementation, the light source 526 may comprise one or more LEDs, quantum dot-based LEDs or the like. The light source can be in communication with the control component 522 and be illuminated, for example, when a user draws on the aerosol source member 304, when coupled to the control body 302, as detected by the flow sensor 520.

The control body 302 of the depicted implementation includes one or more heating assemblies 528 (individually or collectively referred to a heating assembly) configured to heat the aerosol precursor composition 410 of the aerosol source member 304. Although the heating assembly of various implementations of the present disclosure may take a variety of forms, in the particular implementation depicted in FIGS. 5 and 6, the heating assembly comprises an outer cylinder 530 and a heating element 532 (aerosol production component), which in this implementation comprises a plurality of heater prongs that extend from a receiving base 534 (in various configurations, the heating assembly or more specifically the heater prongs may be referred to as a heater). In the depicted implementation, the outer cylinder comprises a double-walled vacuum tube constructed of stainless steel so as to maintain heat generated by the heater prongs within the outer cylinder, and more particularly, maintain heat generated by heater prongs within the aerosol precursor composition. In various implementations, the heater prongs may be constructed of one or more conductive materials, including, but not limited to, copper, aluminum, platinum, gold, silver, iron, steel, brass, bronze, graphite, or any combination thereof.

As illustrated, the heating assembly 528 may extend proximate an engagement end of the housing 516, and may be configured to substantially surround a portion of the heated end 406 of the aerosol source member 304 that includes the aerosol precursor composition 410. In such a manner, the heating assembly may define a generally tubular configuration. As illustrated in FIGS. 5 and 6, the heating element 532 (e.g., plurality of heater prongs) is surrounded by the outer cylinder 530 to create a receiving chamber 536. In such a manner, in various implementations the outer cylinder may comprise a nonconductive insulating material and/or construction including, but not limited to, an insulating polymer (e.g., plastic or cellulose), glass, rubber, ceramic, porcelain, a double-walled vacuum structure, or any combinations thereof.

In some implementations, one or more portions or components of the heating assembly 528 may be combined with, packaged with, and/or integral with (e.g., embedded within) the aerosol precursor composition 410. For example, in some implementations the aerosol precursor composition may be formed of a material as described above and may include one or more conductive materials mixed therein. In some of these implementations, contacts may be connected directly to the aerosol precursor composition such that, when the aerosol source member is inserted into the receiving chamber of the control body, the contacts make electrical connection with the electrical energy source. Alternatively, the contacts may be integral with the electrical energy source and may extend into the receiving chamber such that, when the aerosol source member is inserted into the receiving chamber of the control body, the contacts make electrical connection with the aerosol precursor composition. Because of the presence of the conductive material in the aerosol precursor composition, the application of power from the electrical energy source to the aerosol precursor composition allows electrical current to flow and thus produce heat from the conductive material. Thus, in some implementations the heating element may be described as being integral with the aerosol precursor composition. As a non-limiting; example, graphite or other suitable, conductive material may be mixed with, embedded in, or otherwise present directly on or within the material forming the aerosol precursor composition to make the heating element integral with the medium.

As noted above, in the illustrated implementation, the outer cylinder 530 may also serve to facilitate proper positioning of the aerosol source member 304 when the aerosol source member is inserted into the housing 516. In various implementations, the outer cylinder of the heating assembly 528 may engage an internal surface of the housing to provide for alignment of the heating assembly with respect to the housing. Thereby, as a result of the fixed coupling between the heating assembly, a longitudinal axis of the heating assembly may extend substantially parallel to a longitudinal axis of the housing. In particular, the support cylinder may extend from the opening 518 of the housing to the receiving base 534 to create the receiving chamber 536.

The heated end 406 of the aerosol source member 304 is sized and shaped for insertion into the control body 302. In various implementations, the receiving chamber 536 of the control body may be characterized as being defined by a wall with an inner surface and an outer surface, the inner surface defining the interior volume of the receiving chamber. For example, in the depicted implementations, the outer cylinder 530 defines an inner surface defining the interior volume of the receiving chamber. In the illustrated implementation, an inner diameter of the outer cylinder may be slightly larger than or approximately equal to an outer diameter of a corresponding aerosol source member (e.g., to create a sliding fit) such that the outer cylinder is configured to guide the aerosol source member into the proper position (e.g., lateral position) with respect to the control body. Thus, the largest outer diameter (or other dimension depending upon the specific cross-sectional shape of the implementations) of the aerosol source member may be sized to be less than the inner diameter (or other dimension) at the inner surface of the wall of the open end of the receiving chamber in the control body. In some implementations, the difference in the respective diameters may be sufficiently small so that the aerosol source member fits snugly into the receiving chamber, and frictional forces prevent the aerosol source member from being moved without an applied force. On the other hand, the difference may be sufficient to allow the aerosol source member to slide into or out of the receiving chamber without requiring undue force.

In the illustrated implementation, the control body 302 is configured such that when the aerosol source member 304 is inserted into the control body, the heating element 532 (e.g., heater prongs) is located in the approximate radial center of at least a portion of the aerosol precursor composition 410 of the heated end 406 of the aerosol source member. In such a manner, when used in conjunction with a solid or semi-solid aerosol precursor composition, the heater prongs may be in direct contact with the aerosol precursor composition. In other implementations, such as when used in conjunction with an extruded aerosol precursor composition that defines a tube structure, the heater prongs may be located inside of a cavity defined by an inner surface of the extruded tube structure, and would not contact the inner surface of the extruded tube structure.

During use, the consumer initiates heating of the heating assembly 528, and in particular, the heating element 532 that is adjacent the aerosol precursor composition 410 (or a specific layer thereof). Heating of the aerosol precursor composition releases the inhalable substance within the aerosol source member 304 so as to yield the inhalable substance. When the consumer inhales on the mouth end 408 of the aerosol source member, air is drawn into the aerosol source member through an air intake 538 such as openings or apertures in the control body 302. The combination of the drawn air and the released inhalable substance is inhaled by the consumer as the drawn materials exit the mouth end of the aerosol source member. In some implementations, to initiate heating, the consumer may manually actuate a push-button or similar component that causes the heating element of the heating assembly to receive electrical energy from the battery or other energy source. The electrical energy may be supplied for a pre-determined length of time or may be manually controlled.

In some implementations, flow of electrical energy does not substantially proceed in between puffs on the device 300 (although energy flow may proceed to maintain a baseline temperature greater than ambient temperature—e.g., a temperature that facilitates rapid heating to the active heating temperature). In the depicted implementation, however, heating is initiated by the puffing action of the consumer through use of one or more sensors, such as flow sensor 520. Once the puff is discontinued, heating will stop or be reduced. When the consumer has taken a sufficient number of puffs so as to have released a sufficient amount of the inhalable substance (e.g., an amount sufficient to equate to a typical smoking experience), the aerosol source member 304 may be removed from the control body 302 and discarded. In some implementations, further sensing elements, such as capacitive sensing elements and other sensors, may be used as discussed in U.S. patent application Ser. No. 15/707,461 to Phillips et al., which is incorporated herein by reference.

In various implementations, the aerosol source member 304 may be formed of any material suitable for forming and maintaining an appropriate conformation, such as a tubular shape, and for retaining therein the aerosol precursor composition 410. In some implementations, the aerosol source member may be formed of a single wall or, in other implementations, multiple walls, and may be formed of a material (natural or synthetic) that is heat resistant so as to retain its structural integrity—e.g., does not degrade—at least at a temperature that is the heating temperature provided by the electrical heating element, as further discussed herein. While in some implementations, a heat resistant polymer may be used, in other implementations, the aerosol source member may be formed from paper, such as a paper that is substantially straw-shaped. As further discussed herein, the aerosol source member may have one or more layers associated therewith that function to substantially prevent movement of vapor therethrough. In one example implementation, an aluminum foil layer may be laminated to one surface of the aerosol source member. Ceramic materials also may be used. In further implementations, an insulating material may be used so as not to unnecessarily move heat away from the aerosol precursor composition. Further example types of components and materials that may be used to provide the functions described above or be used as alternatives to the materials and components noted above can be those of the types set forth in U.S. Pat. App. Pub. Nos. 2010/00186757 to Crooks et al., 2010/00186757 to Crooks et al., and 2011/0041861 to Sebastian et al., all of which are incorporated herein by reference.

In the depicted implementation, the control body 302 includes a control component 522 that controls the various functions of the aerosol delivery device 300, including providing power to the electrical heating element 532. For example, the control component may include processing circuitry (which may be connected to further components, as further described herein) that is connected by electrically conductive wires (not shown) to the power source 524. In various implementations, the processing circuitry may control when and how the heating assembly 528, and particularly the heater prongs, receives electrical energy to heat the aerosol precursor composition 410 for release of the inhalable substance for inhalation by a consumer. In some implementations, such control may be activated by a flow sensor 520 as described in greater detail above.

As seen in FIGS. 5 and 6, the heating assembly 528 of the depicted implementation comprises an outer cylinder 530 and a heating element 532 (e.g., plurality of heater prongs) that extend from a receiving base 534. In some implementations, such as those wherein the aerosol precursor composition 410 comprises a tube structure, the heater prongs may be configured to extend into a cavity defined by the inner surface of the aerosol precursor composition. In other implementations, such as the depicted implementation wherein the aerosol precursor composition comprises a solid or semi-solid, the plurality of heater prongs are configured to penetrate into the aerosol precursor composition contained in the heated end 406 of the aerosol source member 304 when the aerosol source member is inserted into the control body 302. In such implementations, one or more of the components of the heating assembly, including the heater prongs and/or the receiving base, may be constructed of a non-stick or stick-resistant material, for example, certain aluminum, copper, stainless steel, carbon steel, and ceramic materials. In other implementations, one or more of the components of the heating assembly, including the heater prongs and/or the receiving base, may include a non-stick coating, including, for example, a polytetrafluoroethylene (PTFE) coating, such as Teflon®, or other coatings, such as a stick-resistant enamel coating, or a ceramic coating, such as Greblon®, or Thermolon™.

In addition, although in the depicted implementation there are multiple heater prongs 532 that are substantially equally distributed about the receiving base 534, it should be noted that in other implementations, any number of heater prongs may be used, including as few as one, with any other suitable spatial configuration. Furthermore, in various implementations the length of the heater prongs may vary. For example, in some implementations the heater prongs may comprise small projections, while in other implementations the heater prongs may extend any portion of the length of the receiving chamber 536, including up to about 25%, up to about 50%, up to about 75%, and up to about the full length of the receiving chamber. In still other implementations, the heating assembly 528 may take on other configurations. Examples of other heater configurations that may be adapted for use in the present invention per the discussion provided above can be found in U.S. Pat. No. 5,060,671 to Counts et al., U.S. Pat. No. 5,093,894 to Deevi et al., U.S. Pat. No. 5,224,498 to Deevi et al., U.S. Pat. No. 5,228,460 to Sprinkel Jr., et al., U.S. Pat. No. 5,322,075 to Deevi et al., U.S. Pat. No. 5,353,813 to Deevi et al., U.S. Pat. No. 5,468,936 to Deevi et al., U.S. Pat. No. 5,498,850 to Das, U.S. Pat. No. 5,659,656 to Das, U.S. Pat. No. 5,498,855 to Deevi et al., U.S. Pat. No. 5,665,262 to Hajaligol, and U.S. Pat. No. 5,573,692 to Das et al.; and U.S. Pat. No. 5,591,368 to Fleischhauer et al., which are incorporated herein by reference.

In various implementations, the control body 302 may include an air intake 538 (e.g., one or more openings or apertures) therein for allowing entrance of ambient air into the interior of the receiving chamber 536. In such a manner, in some implementations the receiving base 534 may also include an air intake. Thus, in some implementations when a consumer draws on the mouth end of the aerosol source member 304, air can be drawn through the air intake of the control body and the receiving base into the receiving chamber, pass into the aerosol source member, and be drawn through the aerosol precursor composition 410 of the aerosol source member for inhalation by the consumer. In some implementations, the drawn air carries the inhalable substance through the optional filter 414 and out of an opening at the mouth end 408 of the aerosol source member. With the heating element 532 positioned inside the aerosol precursor composition, the heater prongs may be activated to heat the aerosol precursor composition and cause release of the inhalable substance through the aerosol source member.

As described above with reference to FIGS. 5 and 6 in particular, various implementations of the present disclosure employ a conductive heater to heat the aerosol precursor composition 410. As also indicated above, various other implementations employ an induction heater to heat the aerosol precursor composition. In some of these implementations, the heating assembly 528 may be configured as an induction heater that comprises a transformer with an induction transmitter and an induction receiver. In implementations in which the heating assembly is configured as the induction heater, the outer cylinder 530 may be configured as the induction transmitter, and the heating element 532 (e.g., plurality of heater prongs) that extend from the receiving base 534 may be configured as the induction receiver. In various implementations, one or both of the induction transmitter and induction receiver may be located in the control body 302 and/or the aerosol source member 304.

In various implementations, the outer cylinder 530 and heating element 532 as the induction transmitter and induction receiver may be constructed of one or more conductive materials, and in further implementations the induction receiver may be constructed of a ferromagnetic material including, but not limited to, cobalt, iron, nickel, and combinations thereof. In one example implementation, the foil material is constructed of a conductive material and the heater prongs are constructed of a ferromagnetic material. In various implementations, the receiving base may be constructed of a non-conductive and/or insulating material.

The outer cylinder 530 as the induction transmitter may include a laminate with a foil material that surrounds a support cylinder. In some implementations, the foil material may include an electrical trace printed thereon, such as, for example, one or more electrical traces that may, in some implementations, form a helical coil pattern when the foil material is positioned around the heating element 532 as the induction receiver. The foil material and support cylinder may each define a tubular configuration. The support cylinder may be configured to support the foil material such that the foil material does not move into contact with, and thereby short-circuit with, the heater prongs. In such a manner, the support cylinder may comprise a nonconductive material, which may be substantially transparent to an oscillating magnetic field produced by the foil material. In various implementations, the foil material may be imbedded in, or otherwise coupled to, the support cylinder. In the illustrated implementation, the foil material is engaged with an outer surface of the support cylinder; however, in other implementations, the foil material may be positioned at an inner surface of the support cylinder or be fully imbedded in the support cylinder.

The foil material of the outer cylinder 530 may be configured to create an oscillating magnetic field (e.g., a magnetic field that varies periodically with time) when alternating current is directed through it. The heater prongs of the heating element 532 may be at least partially located or received within the outer cylinder and include a conductive material. By directing alternating current through the foil material, eddy currents may be generated in the heater prongs via induction. The eddy currents flowing through the resistance of the material defining the heater prongs may heat it by Joule heating (i.e., through the Joule effect). The heater prongs may be wirelessly heated to form an aerosol from the aerosol precursor composition 410 positioned in proximity to the heater prongs.

Other implementations of the aerosol delivery device, control body and aerosol source member are described in the above-cited U.S. patent application Ser. No. 15/916,834 to Sur et al.; U.S. patent application Ser. No. 15/916,696 to Sur; and U.S. patent application Ser. No. 15/836,086 to Sur.

As described above, the aerosol delivery device of example implementations may include various electronic components in the context of an electronic cigarette, heat-electronic cigarette or heat-not-burn device, or even in the case of a device that includes the functionality of both an electronic cigarette and heat-not-burn device. FIGS. 7 and 8 illustrate circuit diagrams of aerosol delivery devices 700, 800 that may be or incorporate functionality of any one or more of aerosol delivery devices 100, 300 according to various example implementations of the present disclosure.

As shown in FIGS. 7 and 8, the aerosol delivery device 700, 800 includes a control body 702 with a control component 704 (with processing circuitry 706) and a power source 708 that may correspond to or include functionality of respective ones of the control body 102, 302, control component 208, 522, and power source 212, 524. The aerosol delivery device also includes a heating element 710 that may correspond to or include functionality of heating element 228, 534. In some implementations, aerosol delivery device and in particular the control body includes terminals 712 configured to connect the power source 704 to the aerosol delivery device or in particular the control body, and the power source is configured to provide an output voltage. The control body may include the heating element or second terminals 714 configured to connect the heating element to the control body.

In some examples, the aerosol delivery device 700, 800 includes a sensor 716 that may correspond to or include functionality of sensor 210, 520. The sensor may be a pressure sensor configured to produce measurements of pressure caused by a flow of air through at least a portion of the aerosol delivery device, or otherwise receive input to indicate use of the aerosol delivery device. The sensor is configured to convert the measurements/user input to corresponding electrical signals, which may include conversion of analog to digital. In some examples, this sensor may be a digital sensor, digital pressure sensor or the like, some suitable examples of which are manufactured by Murata Manufacturing Co., Ltd.

The processing circuitry 706 may be configured to switchably connect the output voltage from the power source 708 to a load 718 including the heating element 710 and thereby power the heating element. More particularly, for example, the processing circuitry may be configured to receive the corresponding electrical signals from the sensor 716, and in response connect the power source to the load including the heating element and thereby power the heating element. The processing circuitry may be configured to process the corresponding electrical signals to determine an on/off condition, and may modulate switching connection of the output voltage of the power source to the load in proportion to the measurements/user input produced by the sensor.

In some examples, the control component 704 further includes a switch 720 such as a high-side load switch (LS) coupled to and between the power source 706 and the heating element 710 (or the load including the heating element), and controllable by the processing circuitry 706 to connect and disconnect the output voltage from power source 708 to and from the load including the heating element. In some more particular examples, the processing circuitry may be configured to output a pulse-width modulation (PWM) signal during a heating time period to cause the switch to switchably connect and disconnect the output voltage (of the power source) to power the heating element. The heating time period may be initiated by a user puff that causes a flow of air through at least a portion of the aerosol delivery device 700. The PWM signal includes pulses over which the output voltage to the heating element may be connected, and between which the output voltage to the heating element may be disconnected.

In some examples, the processing circuitry 706 may be configured to measure a heating current $I_{HEATER}$ through the heating element 710, a heating voltage $V_{HEATER}$ across the heating element, and/or the output voltage $V_{OUTPUT}$ from the power source 708. The heating current may be measured in a number of different manners, such as from current-sense circuitry 722, as shown in FIG. 7. Similarly, as also shown in FIG. 7, the heating voltage may be measured in a number of different manners, such as using a voltage divider 724 configured to reduce the heating voltage to the processing circuitry. As also shown, in both FIGS. 7 and 8, the aerosol delivery device may include a (second) voltage divider from which the processing circuitry may measure the output voltage $V_{OUTPUT}$ from the power source 708. In some examples, the processing circuitry may operate on the actual heating current, heating voltage and/or output voltage (or reduced voltages), or the processing circuitry may include one or more analog-to-digital converters (ADCs) configured to convert the actual current and voltages to respective digital equivalents.

As shown in FIG. 8, in some examples, the processing circuitry 706 of the aerosol delivery device 800 may be configured to output a pulse of known current $I_{KNOWN}$ to the heating element 710, which may be a fixed current in some examples. In some of these examples, this known current may equal or substantially equal the heating current $I_{HEATER}$ through the heating element 710, in which case the processing circuitry may measure the heating current without current-sense circuitry 722. Also in some of these examples, the known current may be current limited such as through use of appropriate current-limiting circuitry 826.

In some examples of the aerosol delivery device 800 of FIG. 8, the heating element 710 may have a resistance that is variable and proportional to a temperature of the heating element. The processing circuitry, then, may be further configured to output the pulse of known current $I_{KNOWN}$ to the heating element 710, and measure voltage across the heating element—the heating voltage $V_{HEATER}$, between adjacent pulses of the PWM signal. FIG. 9 illustrates an example PWM signal 900 including pulses 902 over which the output voltage $V_{OUTPUT}$ to the heating element may be connected, and between which the output voltage to the heating element may be disconnected. 10 illustrates the example PWM signal superimposed with measurements of $V_{HEATER}$ between pulses when $I_{KNOWN}$ is output to the heating element. The pulses themselves cause voltage across the heating element to be produced, and the known current may be selected such that the voltage is less than one-half the output voltage provided by the power source.

In some examples, the pulses 902 of the known current may be interspersed between the pulses of the PWM signal 900. In some of these examples, the processing circuitry 706 may be configured to measure the voltage across the heating element $V_{HEATER}$ for each of the pulses.

Returning to FIG. 8, the processing circuitry 706 may be configured to calculate the resistance of the heating element $R_{HEATER}$ based on the known current and the voltage, such as in the following manner:

$$R_{HEATER} = V_{HEATER}/I_{KNOWN} \quad (1)$$

The processing circuitry may then calculate the temperature of the heating element $T_{HEATER}$ based on the resistance, such as according to the following:

$$T_{HEATER} = T_{NOM} + ((R_{NOM} \times R_{HEATER})/(TCR \times R_{NOM})) \quad (2)$$

In the preceding, $T_{NOM}$ is an ambient or nominal temperature of the heating element, $R_{NOM}$ is the nominal resistance of the heating element at $T_{NOM}$, and TCR is the temperature coefficient of resistance of the heating element.

In some examples, the processing circuitry 706 may calculate the temperature of the heating element 710 for each of the pulses 902 of the known current over the heating time period. The processing circuitry may begin when the heating time period is initiated, such as in response to a user puff that causes a flow of air through at least a portion of the aerosol delivery device, which may be measured by the sensor 716. The aerosol delivery device may thereby account for any remaining heat at the heating element from a prior heating time period.

The processing circuitry 706 may be further configured to adjust a duty cycle of the PWM signal 900 when the temperature deviates from a predetermined target. This may include the processing circuitry configured to increase or decrease the duty cycle of the PWM signal when the temperature is respectively below or above the predetermined target. That is, the processing circuitry may increase the duty cycle when the temperature is below the predetermined target, and decrease the duty cycle when the temperature is above the predetermined target. In some examples, the processing circuitry may repeatedly calculate the temperature of the heating element over the heating time period. The processing circuitry may begin when the heating time period is initiated, such as in response to a user puff that causes a flow of air through at least a portion of the aerosol delivery device, which may be measured by the sensor 716. The aerosol delivery device may thereby account for any remaining heat at the heating element from a prior heating time period.

In some examples, the target may be a target set point temperature. In other examples, the target may be a range of temperatures. One example of a suitable range of temperatures is reflected by a target set point temperature+/−an acceptable tolerance from the target set point temperature. A suitable range of temperatures may also be used to reflect an amount of added hysteresis. In some of these examples, the processing circuitry 706 may increase the duty cycle when the temperature is below a first target set point temperature, and decrease the duty cycle when the temperature is above a second target set point temperature that is higher than the first target set point temperature.

In some examples, the target may vary over time in accordance with a temperature or power control profile that may be applied during a time period of usage. In some examples, the target may vary or otherwise be variable according to the measurement of pressure caused by airflow through at least a portion of the housing of the aerosol delivery device 700 (e.g., housing 206, 516), produced by the sensor 716. In more particular examples, the target may be variable according to a predetermined relationship between pressure and the target. Examples of suitable predetermined relationships may be described by a step function, a linear function, a non-linear function, or a combination thereof.

In some examples, the heating time period may be divided into multiple portions, and the target may differ for the different portions. The target may include a first target set point temperature or profile for a first portion of the heating time period after the heating time period is initiated, and a second target set point temperature or profile for a second portion of the heating time period. In a more particular example, the target may include a target set point temperature for a first portion of the heating time period, and a profile in which the target varies with pressure for a second portion of the heating time period.

In some examples, outside the heating time period in which the PWM signal is absent and the output voltage to the heating element 710 is disconnected, the processing circuitry 706 may be further configured to output a second pulse of the known current to the heating element, and measure a second voltage across the heating element. The processing circuitry may be configured to calculate the nominal resistance of the heating element $R_{NOM}$ based on the known current $I_{KNOWN}$ and the second voltage $V_{HEATER}$, such as according to equation (1) above. The processing circuitry may calculate the nominal temperature of the heating element $T_{NOM}$ based on nominal resistance, such as according to the following:

$$T_{NOM} = (((R_{NOM}/R_{ROOM})-1)/TCR) + T_{ROOM} \qquad (3)$$

In equation (3), $T_{ROOM}$ refers to room temperature (e.g., 20° C.), and $R_{ROOM}$ refers to resistance of the heating element at $T_{ROOM}$. In other examples, the nominal temperature may be determined using a separate component such as a pressure sensor, microcontroller unit (MCU), independent negative temperature coefficient thermistor (NTC), or infrared temperature sensor configured to directly measure the temperature. Regardless of how the nominal temperature is determined, the processing circuitry may then be configured to calculate the temperature of the heating element further based on the nominal temperature of the heating element, such as in the manner described above.

In some examples, the processing circuitry 706 of the aerosol delivery device 700, 800 may be further configured to calculate—or repeatedly calculate—a quantity of heat at the heating element 710 during the heating time period, and execute a lockout of the heating element when the quantity of heat at the heating element is greater than a threshold quantity of heat. This quantity of heat may be measured in joules, although the quantity of heat may be measured in other units such as British Thermal Units (BTUs), calories or the like.

In some examples, again, the heating time period may be initiated by a user puff that causes a flow of air through at least a portion of the aerosol delivery device 700. In some of these examples, calculation of the quantity of heat at the heating element includes the processing circuitry 706 configured to measure the heating current $I_{HEATER}$ through and heating voltage $V_{HEATER}$ across the heating element. Again, the heating current may be measured in a number of different manners, such as from current-sense circuitry 722 as shown in FIG. 7. Similarly, the heating voltage may be measured in a number of different manners, such as using a voltage divider 724 configured to reduce the heating voltage to the processing circuitry.

Regardless of the exact manner by which the heating current $I_{HEATER}$ and heating voltage $V_{HEATER}$ are measured, in some examples, the processing circuitry 706 may be configured to calculate a first quantity of heat added to the heating element 710 based on the heating current, the heating voltage, an elapsed time, and the duty cycle of the PWM signal, such as according to the following:

$$Q_1 = V_{HEATER} \times I_{HEATER} \times \text{Time} \times \text{Duty} \qquad (4)$$

In equation (4), $Q_1$ is the first quantity of heat, Time is the elapsed time, and Duty is the duty cycle of the PWM signal.

The processing circuitry 706 may be configured to determine a second quantity of heat removed from the heating element by forced convection due to the flow of air caused by the user puff, which may be represented as $Q_2$. And the processing circuitry may be configured to calculate the quantity of heat at the heating element based on the first quantity of heat and the second quantity of heat, such as according to the following equation (5) in which $Q_{HEATER}$ is the quantity of heat at the heating element:

$$Q_{HEATER} = Q_1 - Q_2 \qquad (5)$$

In some examples, calculation of $Q_{HEATER}$ under normal puff conditions may involve use of volumetric flowrate of a puff and therefore heat loss by forced convection, $Q_2$. The flowrate may be preset or otherwise determined from empirical studies or other parametric inputs to the processing circuitry 706. The flowrate may be extrapolated by an analog representation of puff pressure (the sensor 716 converting true pressure to an analog signal) or by the addition of another sensor that may otherwise provide an analog representation of airflow through the aerosol delivery device 700, 800. The signal from the sensor, then, may be used to pull an empirically-derived value from a look-up table. One example of a suitable sensor is a MEMS microphone such as that described in U.S. Pat. Pub. No. 2016/0128389 to Lamb et al., which is incorporated herein by reference. Another example of a suitable sensor is an absolute flow meter (or flow sensor) in the flow path and configured to measure the volumetric flowrate of a puff and therefore heat loss by forced convection.

The processing circuitry 706 of the aerosol delivery device 700, 800 may be configured to execute a lockout of the heating element 710 when the quantity of heat at the heating element $Q_{HEATER}$ is greater than a threshold quantity of heat. Lockout of the heating element may be implemented in a number of different manners. The processing circuitry may suppress the PWM signal to the switch 720 and thereby keep the output voltage from the power source 708 to the heating element disconnected until the quantity of heat at the heating element is a quantity less than the threshold quantity of heat. In some examples, lockout of the heating element may include the processing circuitry configured to interrupt the PWM signal to cause the switch to disconnect the output voltage to the heating element, and keep the output voltage from the power source to the heating element disconnected until the quantity of heat at the heating element is the quantity less than the threshold quantity of heat.

Additionally or alternatively, in some examples, the processing circuitry 706 may output an enable signal to a second switch 726 connected between the heating element 710 and circuit ground, causing the second switch to close and thereby enable current flow through the heating element. Lockout of the heating element, then, may include the processing circuitry configured to suppress the enable signal to cause the second switch to open and thereby cause an open-circuit condition at the heating element. The second switch may then be kept open until the quantity of heat at the heating element is the quantity less than the threshold quantity of heat.

In some further examples, lockout of the heating element 710 further includes the processing circuitry 706 configured to determine a third quantity of heat removed from the heating element by natural convection due to exposure of the heating element to ambient air, which may be represented as $Q_3$. This heat removal may often be far less than the heat removed by forced convection caused by the user puff (i.e., $Q_3 \ll Q_2$). The processing circuitry may be configured to calculate a quantity of any remaining heat at the heating element from the heating time period, based on the quantity of heat at the heating element, and the third quantity of heat, such as in accordance with the following equation (6) in which $Q_{HEATER\_REMAIN}$ is the quantity of any remaining heat at the heating element:

$$Q_{HEATER\_REMAIN} = Q_{HEATER} - Q_3 \qquad (6)$$

The processing circuitry may then be configured to keep the output voltage from the power source 708 to the heating element disconnected until the quantity of any remaining heat at the heating element is the quantity less than the threshold quantity of heat.

In some examples, the user puff is one of a plurality of user puffs that also includes a second user puff that causes a second flow of air through at least a portion of the aerosol delivery device 700, and that initiates a second heating time period. In some of these examples, between the heating time period and the second heating time period, the processing circuitry 706 may be further configured to determine $Q_3$, and calculate the quantity of any remaining heat at the heating element 710 from the heating time period, such as according to equation (6) above. The processing circuitry, then, may be further configured to calculate the quantity of heat at the heating element during the second heating time period, based on the quantity of any remaining heat at the heating element from the heating time period, such as according to equation (7):

$$Q_{HEATER(2)} = Q_{HEATER\_REMAIN} + Q_{1(2)} - Q_{2(2)} \qquad (7)$$

In the preceding the parenthetical (2) indicates quantities during the second heating time period for the second user puff.

Similar to heat loss by forced convection, in some examples, calculation of $Q_{HEATER\_REMAIN}$ may involve an understanding of heat loss due to exposure of the heating element to ambient air, $Q_3$. Resistance of the heating element $R_{HEATER}$ may be periodically measured or calculated such as in the manner above, and from which $Q_3$ may be determined, such as described above. In some examples, $Q_3$ may be simply ignored as the heating time period may be relatively short compared to that required to make ambient losses significant ($Q_2 \gg Q_3$).

In some examples, the processing circuitry 706 may include separate and distinct processors to power the heating element 710, and monitor (calculate) and execute the lockout of the heating element. FIG. 11 illustrates processing circuitry 1100 that in some examples may correspond to processing circuitry 706. As shown in FIG. 11, the processing circuitry may include a processor 1102 configured to output a PWM signal during the heating time period to cause the switch 720 to switchably connect and disconnect the output voltage to the heating element to power the heating element. The processing circuitry may also include a second processor 1104 configured to output an enable signal designed to enable the PWM signal to pass to the switch. In this regard, the PWM signal and enable signal may be input to an AND gate 1106 configured to implement a logical conjunction in which the PWM signal is output only when the enable signal is provided. To execute the lockout in these implementations, the second processor may suppress the enable signal to thereby cause the AND gate to suppress the PWM signal to the switch.

FIG. 12 illustrates processing circuitry 1200 that in other examples may correspond to processing circuitry 706, particularly in implementations in which the aerosol delivery device 700, 800 includes the second switch 726 connected between the heating element 710 and circuit ground. In these example implementations, the processor 1102 may output the PWM signal during the heating time period to cause the switch 720 to switchably connect and disconnect the output voltage to the heating element to power the heating element. The second processor 1104 may output an enable signal to the second switch 726 to enable current flow through the heating element, and suppress the enable signal during lockout to cause the second switch to open and thereby cause an open-circuit condition at the heating element.

FIG. 13 is a flowchart illustrating various operations in a method 1300 of controlling an aerosol delivery device 700, 800, according to example implementations of the present disclosure. As shown at block 1302, the method may include switchably connecting and disconnecting the output voltage to the heating element 710 to power the heating element according to a PWM signal. The PWM signal includes pulses over which the output voltage to the heating element is connected, and between which the output voltage to the heating element is disconnected.

The method 1300 may include outputting a pulse of known current to the heating element, and measuring voltage across the heating element 710, between adjacent pulses of the PWM signal, as shown at block 1304. The method may include calculating the resistance of the heating element based on the known current and the voltage, and calculating the temperature of the heating element based on the resistance, as shown at blocks 1306 and 1308. And the method may include adjusting a duty cycle of the PWM signal when the temperature deviates from a predetermined target, as shown at block 1310.

FIG. 14 is a flowchart illustrating various operations in another method 1400 of controlling an aerosol delivery device 700, 800, according to example implementations of the present disclosure. Similar to before, the method may include switchably connecting and disconnecting the output voltage to the heating element 710 to power the heating element according to a PWM signal, as shown at block 1402. Again, the PWM signal includes pulses over which the output voltage to the heating element is connected, and between which the output voltage to the heating element is disconnected. As also shown, the method may include calculating a quantity of heat at the heating element during the heating time period, and executing a lockout of the heating element when the quantity of heat at the heating element is greater than a threshold quantity of heat, as shown at blocks 1404 and 1406.

The foregoing description of use of the article(s) can be applied to the various example implementations described herein through minor modifications, which can be apparent to the person of skill in the art in light of the further disclosure provided herein. The above description of use, however, is not intended to limit the use of the article but is provided to comply with all necessary requirements of disclosure of the present disclosure. Any of the elements shown in the article(s) illustrated in FIGS. 1-12 or as otherwise described above may be included in an aerosol delivery device according to the present disclosure.

Many modifications and other implementations of the disclosure will come to mind to one skilled in the art to which this disclosure pertains having the benefit of the teachings presented in the foregoing descriptions and the associated figures. Therefore, it is to be understood that the disclosure is not to be limited to the specific implementations disclosed herein and that modifications and other implementations are intended to be included within the scope of the appended claims. Although specific terms are employed herein, they are used in a generic and descriptive sense only and not for purposes of limitation.

What is claimed is:

1. An aerosol delivery device comprising:
a power source configured to provide an output voltage;
a heating element powerable to vaporize components of an aerosol precursor composition and thereby produce an aerosol, the heating element having a resistance that is variable and proportional to a temperature of the heating element;
a switch coupled to and between the power source and the heating element; and processing circuitry coupled to the switch, and configured to output a pulse-width modulation (PWM) signal during a heating time period to cause the switch to switchably connect and disconnect the output voltage to the heating element to power the heating element, the PWM signal including pulses over which the output voltage to the heating element is connected, and between which the output voltage to the heating element is disconnected,
wherein the processing circuitry is further configured to output a pulse of known current to the heating element, and measure voltage across the heating element, between adjacent pulses of the PWM signal, and
wherein the processing circuitry is configured to calculate the resistance of the heating element based on the known current and the voltage, calculate the temperature of the heating element based on the resistance, and adjust a duty cycle of the PWM signal when the temperature deviates from a predetermined target by increasing or decreasing the duty cycle of the PWM signal when the temperature is respectively below or above the predetermined target.

2. The aerosol delivery device of claim 1, wherein the processing circuitry configured to output the pulse includes the processing circuitry configured to output pulses of the known current, interspersed between the pulses of the PWM signal, the processing circuitry configured to measure the voltage across the heating element for each of the pulses.

3. The aerosol delivery device of claim 1, wherein the pulse of known current that is output to the heating element causes the voltage across the heating element to be produced, and the known current is selected such that the voltage is less than one-half the output voltage provided by the power source.

4. The aerosol delivery device of claim 1, wherein outside the heating time period in which the PWM signal is absent and the output voltage to the heating element is disconnected, the processing circuitry is further configured to output a second pulse of the known current to the heating element, and measure a second voltage across the heating element,
wherein the processing circuitry is configured to calculate a nominal resistance of the heating element based on the known current and the second voltage, and calculate a nominal temperature of the heating element based on nominal resistance, and
wherein the processing circuitry is configured to calculate the temperature of the heating element further based on the nominal temperature of the heating element.

5. The aerosol delivery device of claim 1, wherein the processing circuitry is further configured to calculate a quantity of heat at the heating element during the heating time period, and execute a lockout of the heating element when the quantity of heat at the heating element is greater than a threshold quantity of heat.

6. An aerosol delivery device comprising:
a power source configured to provide an output voltage;
a heating element powerable to vaporize components of an aerosol precursor composition and thereby produce an aerosol;
a switch coupled to and between the power source and the heating element; and processing circuitry coupled to the switch, and configured to output a pulse-width modulation (PWM) signal during a heating time period to cause the switch to switchably connect and disconnect the output voltage to the heating element to power the heating element, the PWM signal including pulses over which the output voltage to the heating element is connected, and between which the output voltage to the heating element is disconnected, wherein the processing circuitry is further configured to calculate a quantity of heat at the heating element during the heating time period, and execute a lockout of the heating element when the quantity of heat at the heating element is greater than a threshold quantity of heat.

7. The aerosol delivery device of claim 6, wherein the processing circuitry configured to calculate the quantity of heat at the heating element includes the processing circuitry configured to repeatedly calculate the quantity of heat at the heating element during the heating time period.

8. The aerosol delivery device of claim 6, wherein the heating time period is initiated by a user puff that causes a flow of air through at least a portion of the aerosol delivery device, and wherein the processing circuitry configured to calculate the quantity of heat at the heating element includes the processing circuitry configured to at least:

measure a heating current through and a heating voltage across the heating element;

calculate a first quantity of heat added to the heating element based on the heating current, the heating voltage, an elapsed time, and a duty cycle of the PWM signal;

determine a second quantity of heat removed from the heating element by forced convection due to the flow of air caused by the user puff; and calculate the quantity of heat at the heating element based on the first quantity of heat and the second quantity of heat.

9. The aerosol delivery device of claim 8, wherein the processing circuitry configured to execute the lockout of the heating element includes the processing circuitry configured to at least:

interrupt the PWM signal to cause the switch to disconnect the output voltage to the heating element; and keep the output voltage to the heating element disconnected until the quantity of heat at the heating element is a quantity less than the threshold quantity of heat.

10. The aerosol delivery device of claim 9, wherein the processing circuitry configured to execute the lockout of the heating element further includes the processing circuitry configured to at least:

determine a third quantity of heat removed from the heating element by natural convection due to exposure of the heating element to ambient air; and calculate a quantity of any remaining heat at the heating element from the heating time period, based on the quantity of heat at the heating element, and the third quantity of heat, the processing circuitry configured to keep the output voltage to the heating element disconnected until the quantity of any remaining heat at the heating element is the quantity less than the threshold quantity of heat.

11. The aerosol delivery device of claim 8, wherein the user puff is one of a plurality of user puffs that also includes a second user puff that causes a second flow of air through at least a portion of the aerosol delivery device, and that initiates a second heating time period, wherein between the heating time period and the second heating time period, the processing circuitry is further configured to at least:

determine a third quantity of heat removed from the heating element by natural convection due to exposure of the heating element to ambient air; and calculate a quantity of any remaining heat at the heating element from the heating time period, based on the quantity of heat at the heating element, and the third quantity of heat, and wherein the processing circuitry is further configured to calculate the quantity of heat at the heating element during the second heating time period, based on the quantity of any remaining heat at the heating element from the heating time period.

12. A method of controlling an aerosol delivery device including a power source configured to provide an output voltage, and a heating element powerable to vaporize components of an aerosol precursor composition and thereby produce an aerosol, the heating element having a resistance that is variable and proportional to a temperature of the heating element, the method comprising:

switchably connecting and disconnecting the output voltage to the heating element to power the heating element according to a pulse-width modulation (PWM) signal, the PWM signal including pulses over which the output voltage to the heating element is connected, and between which the output voltage to the heating element is disconnected;

outputting a pulse of known current to the heating element, and measuring voltage across the heating element, between adjacent pulses of the PWM signal;

calculating the resistance of the heating element based on the known current and the voltage;

calculating the temperature of the heating element based on the resistance; and adjusting a duty cycle of the PWM signal when the temperature deviates from a predetermined target.

13. The method of claim 12, wherein adjusting the duty cycle of the PWM signal includes increasing or decreasing the duty cycle of the PWM signal when the temperature is respectively below or above the predetermined target.

14. The method of claim 12, wherein outputting the pulse includes outputting pulses of the known current, interspersed between the pulses of the PWM signal, the voltage across the heating element measured for each of the pulses.

15. The method of claim 12, wherein the pulse of known current that is output to the heating element causes the voltage across the heating element to be produced, and the method further comprises selecting the known current such that the voltage is less than one-half the output voltage provided by the power source.

16. The method of claim 12, wherein outside the heating time period in which the PWM signal is absent and the output voltage to the heating element is disconnected, the method further comprises:

outputting a second pulse of the known current to the heating element, and measuring a second voltage across the heating element;

calculating a nominal resistance of the heating element based on the known current and the second voltage; and calculating a nominal temperature of the heating element based on the nominal resistance, and wherein the temperature of the heating element is calculated further based on the nominal temperature of the heating element.

17. The method of claim 12 further comprising:

calculating a quantity of heat at the heating element during the heating time period; and executing a lockout of the heating element when the quantity of heat at the heating element is greater than a threshold quantity of heat.

18. A method of controlling an aerosol delivery device including a power source configured to provide an output voltage, and a heating element powerable to vaporize components of an aerosol precursor composition and thereby produce an aerosol, the method comprising:
switchably connecting and disconnecting the output voltage to the heating element to power the heating element according to a pulse-width modulation (PWM) signal, the PWM signal including pulses over which the output voltage to the heating element is connected, and between which the output voltage to the heating element is disconnected;
calculating a quantity of heat at the heating element during a heating time period; and
executing a lockout of the heating element when the quantity of heat at the heating element is greater than a threshold quantity of heat.

19. The method of claim 18, wherein calculating the quantity of heat at the heating element includes repeatedly calculating the quantity of heat at the heating element during the heating time period.

20. The method of claim 18, wherein the heating time period is initiated by a user puff that causes a flow of air through at least a portion of the aerosol delivery device, and
wherein calculating the quantity of heat at the heating element includes at least: measuring a heating current through and a heating voltage across the heating element;
calculating a first quantity of heat added to the heating element based on the heating current, the heating voltage, an elapsed time, and a duty cycle of the PWM signal;
determining a second quantity of heat removed from the heating element by forced convection due to the flow of air caused by the user puff; and
calculating the quantity of heat at the heating element based on the first quantity of heat and the second quantity of heat.

21. The method of claim 20, wherein executing the lockout of the heating element includes at least:
interrupting the PWM signal to disconnect the output voltage to the heating element; and
keeping the output voltage to the heating element disconnected until the quantity of heat at the heating element is a quantity less than the threshold quantity of heat.

22. The method of claim 21, wherein executing the lockout of the heating element further includes at least:
determining a third quantity of heat removed from the heating element by natural convection due to exposure of the heating element to ambient air; and
calculating a quantity of any remaining heat at the heating element from the heating time period, based on the quantity of heat at the heating element, and the third quantity of heat, keeping the output voltage to the heating element disconnected includes keeping the output voltage to the heating element disconnected until the quantity of any remaining heat at the heating element is the quantity less than the threshold quantity of heat.

23. The method of claim 20, wherein the user puff is one of a plurality of user puffs that also includes a second user puff that causes a second flow of air through at least a portion of the aerosol delivery device, and that initiates a second heating time period,
wherein between the heating time period and the second heating time period, the method further comprises to at least:
determining a third quantity of heat removed from the heating element by natural convection due to exposure of the heating element to ambient air; and calculating a quantity of any remaining heat at the heating element from the heating time period, based on the quantity of heat at the heating element, and the third quantity of heat, and
wherein the method further comprises calculating the quantity of heat at the heating element during the second heating time period, based on the quantity of any remaining heat at the heating element from the heating time period.

24. An aerosol delivery device comprising:
a power source configured to provide an output voltage;
a heating element powerable to vaporize components of an aerosol precursor composition and thereby produce an aerosol, the heating element having a resistance that is variable and proportional to a temperature of the heating element;
a switch coupled to and between the power source and the heating element; and processing circuitry coupled to the switch, and configured to output a pulse-width modulation (PWM) signal during a heating time period to cause the switch to switchably connect and disconnect the output voltage to the heating element to power the heating element, the PWM signal including pulses over which the output voltage to the heating element is connected, and between which the output voltage to the heating element is disconnected,
wherein the processing circuitry is further configured to output a pulse of known current to the heating element, and measure voltage across the heating element, between adjacent pulses of the PWM signal,
wherein the processing circuitry is configured to calculate the resistance of the heating element based on the known current and the voltage, calculate the temperature of the heating element based on the resistance, and adjust a duty cycle of the PWM signal when the temperature deviates from a predetermined target, and
wherein the processing circuitry configured to output the pulse includes the processing circuitry configured to output pulses of the known current, interspersed between the pulses of the PWM signal, the processing circuitry configured to measure the voltage across the heating element for each of the pulses.

25. An aerosol delivery device comprising:
a power source configured to provide an output voltage;
a heating element powerable to vaporize components of an aerosol precursor composition and thereby produce an aerosol, the heating element having a resistance that is variable and proportional to a temperature of the heating element;
a switch coupled to and between the power source and the heating element; and processing circuitry coupled to the switch, and configured to output a pulse-width modulation (PWM) signal during a heating time period to cause the switch to switchably connect and disconnect the output voltage to the heating element to power the heating element, the PWM signal including pulses over which the output voltage to the heating element is connected, and between which the output voltage to the heating element is disconnected,
wherein the processing circuitry is further configured to output a pulse of known current to the heating element, and measure voltage across the heating element, between adjacent pulses of the PWM signal, wherein the processing circuitry is configured to calculate the resistance of the heating element based on the known current and the voltage, calculate the temperature of the heating element based on the resistance, and adjust a duty cycle of the PWM signal when the temperature deviates from a predetermined target, and wherein the pulse of known current that is output to the heating element causes the voltage across the heating element to be produced, and the known current is selected such that the voltage is less than one-half the output voltage provided by the power source.

26. An aerosol delivery device comprising:

a power source configured to provide an output voltage;

a heating element powerable to vaporize components of an aerosol precursor composition and thereby produce an aerosol, the heating element having a resistance that is variable and proportional to a temperature of the heating element;

a switch coupled to and between the power source and the heating element; and processing circuitry coupled to the switch, and configured to output a pulse-width modulation (PWM) signal during a heating time period to cause the switch to switchably connect and disconnect the output voltage to the heating element to power the heating element, the PWM signal including pulses over which the output voltage to the heating element is connected, and between which the output voltage to the heating element is disconnected, wherein the processing circuitry is further configured to output a pulse of known current to the heating element, and measure voltage across the heating element, between adjacent pulses of the PWM signal, wherein the processing circuitry is configured to calculate the resistance of the heating element based on the known current and the voltage, calculate the temperature of the heating element based on the resistance, and adjust a duty cycle of the PWM signal when the temperature deviates from a predetermined target, wherein outside the heating time period in which the PWM signal is absent and the output voltage to the heating element is disconnected, the processing circuitry is further configured to output a second pulse of the known current to the heating element, and measure a second voltage across the heating element, wherein the processing circuitry is configured to calculate a nominal resistance of the heating element based on the known current and the second voltage, and calculate a nominal temperature of the heating element based on nominal resistance, and wherein the processing circuitry is configured to calculate the temperature of the heating element further based on the nominal temperature of the heating element.

* * * * *